(12) United States Patent
Yukawa et al.

(10) Patent No.: US 8,664,035 B2
(45) Date of Patent: Mar. 4, 2014

(54) MEMORY ELEMENT AND SEMICONDUCTOR DEVICE

(75) Inventors: Mikio Yukawa, Atsugi (JP); Nozomu Sugisawa, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1495 days.

(21) Appl. No.: 11/826,227

(22) Filed: Jul. 13, 2007

(65) Prior Publication Data
US 2008/0023696 A1  Jan. 31, 2008

(30) Foreign Application Priority Data

Jul. 28, 2006 (JP) .................. 2006-206685

(51) Int. Cl.
*H01L 51/40* (2006.01)

(52) U.S. Cl.
USPC .............. 438/99; 257/E33.068; 257/E33.056; 257/E33.058

(58) Field of Classification Search
USPC .................. 257/E39.007, E51.001, E51.008, 257/E51.018; 438/99
See application file for complete search history.

(56) References Cited

U.S. PATENT DOCUMENTS

| | | | |
|---|---|---|---|
| 5,853,905 A | 12/1998 | So et al. | |
| 6,847,047 B2 | 1/2005 | VanBuskirk et al. | |
| 6,943,370 B2 | 9/2005 | VanBuskirk et al. | |
| 7,688,624 B2 | 3/2010 | Abe et al. | |
| 8,295,104 B2 | 10/2012 | Abe et al. | |
| 2002/0021479 A1* | 2/2002 | Scalora et al. | 359/241 |
| 2002/0157702 A1* | 10/2002 | Cordaro | 136/256 |
| 2003/0010376 A1* | 1/2003 | Yamaguchi et al. | 136/251 |
| 2003/0186040 A1* | 10/2003 | Oya | 428/304.4 |
| 2004/0027849 A1 | 2/2004 | Yang et al. | |
| 2004/0057323 A1 | 3/2004 | Tanabe | |
| 2004/0089891 A1* | 5/2004 | Anma et al. | 257/296 |
| 2004/0239597 A1* | 12/2004 | Tanabe | 345/76 |

(Continued)

FOREIGN PATENT DOCUMENTS

| | | |
|---|---|---|
| EP | 1 434 232 | 6/2004 |
| JP | 63266063 | * 11/1988 |

(Continued)

OTHER PUBLICATIONS

Okabayashi et al. "Negative giant surface potential of peeled Alq3 thin films," Thin Film Solids 518, 839-841, 2009.*

(Continued)

*Primary Examiner* — Matthew Reames
(74) *Attorney, Agent, or Firm* — Eric J. Robinson; Robinson Intellectual Property Law Office, P.C.

(57) ABSTRACT

An object is to reduce variations in programming behavior from memory element to memory element. Furthermore, an object is to obtain a semiconductor device with excellent writing characteristics and in which the memory element is mounted. The memory element includes a first conductive layer, a metal oxide layer, a semiconductor layer, an organic compound layer, and a second conductive layer, where the metal oxide layer, the semiconductor layer, and the organic compound layer are interposed between the first conductive layer and the second conductive layer; the metal oxide layer is provided in contact with the first conductive layer; and the semiconductor layer is provided in contact with the metal oxide layer. By use of this kind of structure, variations in programming behavior from memory element to memory element are reduced.

26 Claims, 23 Drawing Sheets

(56) References Cited

U.S. PATENT DOCUMENTS

| | | |
|---|---|---|
| 2005/0008052 A1* | 1/2005 | Nomura et al. .................. 372/39 |
| 2005/0130389 A1* | 6/2005 | Yamazaki et al. ............. 438/455 |
| 2006/0028895 A1 | 2/2006 | Taussig et al. |
| 2006/0082289 A1* | 4/2006 | Yeh et al. ....................... 313/504 |
| 2006/0214008 A1 | 9/2006 | Asami et al. |
| 2007/0051940 A1 | 3/2007 | Clemens et al. |
| 2008/0017849 A1 | 1/2008 | Yukawa et al. |

FOREIGN PATENT DOCUMENTS

| | | |
|---|---|---|
| JP | 11-307261 | 11/1999 |
| JP | 2000-030870 | 1/2000 |
| JP | 2002-026277 | 1/2002 |
| JP | WO 2004/042738 | 5/2004 |
| JP | 2004-200569 | 7/2004 |
| JP | 2005-311336 | 11/2005 |
| JP | 2006-505939 | 2/2006 |
| JP | 2006-179882 | 7/2006 |
| JP | 2006-269950 | 10/2006 |
| JP | 2007-273967 | 10/2007 |
| KR | 2001-0004297 A | 1/2001 |
| WO | WO 2006/043573 | 4/2006 |
| WO | WO 2006/057417 | 6/2006 |
| WO | WO 2006/059746 | 6/2006 |
| WO | WO 2006/101241 | 9/2006 |
| WO | WO 2007/105575 | 9/2007 |

OTHER PUBLICATIONS

Mattis et al., "A Field-Programmable Antifuse Memory for RFID on Plastic", Device Research Conference, Jun. 28, 2006, pp. 215-216.

European Search Report (Application No. 07013501.7) dated Nov. 30, 2007.

International Search Report (Application No. PCT/JP2007/054485) dated Apr. 24, 2007.

Written Opinion (Application No. PCT/JP2007/054485) dated Apr. 24, 2007.

International Search Report (Application No. PCT/JP2006/306373) dated Jul. 4, 2006.

Written Opinion (Application No. PCT/JP2006/306373) dated Jul. 4, 2006.

* cited by examiner

MEMORY ELEMENT AND SEMICONDUCTOR DEVICE

BACKGROUND OF THE INVENTION

1. Field of the Invention

The present invention relates to a memory element and a semiconductor device that includes the memory element.

2. Description of the Related Art

In recent years, development of a semiconductor device in which a plurality of circuits are integrated together over an insulating surface and that has a variety of functions has been progressing. In addition, development of a semiconductor device in which electromagnetic waves received by an antenna provided in the semiconductor device are converted into electrical energy and transmission and reception of data is performed using this electrical energy has been progressing. This kind of semiconductor device is referred to as a wireless chip (also referred to as an ID tag, an IC tag, an IC chip, an RF (radio frequency) tag, a wireless tag, an electronic tag, and RFID (radio frequency identification) and has already been introduced into a part of the marketplace.

Currently, many of these semiconductor devices that have been put into practical use have a circuit (also called an IC (integrated circuit) chip) formed using a semiconductor substrate of silicon or the like and have an antenna. In addition, the IC chip is formed of a memory circuit, a control circuit, and the like. In particular, by provision of a memory circuit with which a lot of data can be stored, an even more highly functional semiconductor device with an even higher added value can be provided. However, even though silicon substrates are expensive, manufacturing these semiconductor devices at low cost is demanded. This is because of an expectation that small semiconductor devices like a wireless chip will need to be semi-disposable. Given this, in recent years, development of organic devices, for example, organic thin film transistors (hereinafter also referred to as organic TFTs), organic memory devices, and the like, in which a control circuit and a memory circuit are formed over a low-cost glass substrate and, furthermore, the control circuit and memory circuit can be formed using an organic compound formed at low temperature, is actively being carried out (for an example, refer to Patent Document 1: Japanese Published Patent Application 2002-26277).

SUMMARY OF THE INVENTION

A memory element that functions as a memory portion of an organic memory device is formed by the provision of an organic compound layer between a pair of electrodes; writing of data (programming) is performed using changes in the electrical characteristics, such as a change in the resistance, by application of a voltage between the electrodes. Although the principle of this kind of operation is quite simple, even in memory elements with the same structure, variations in writing behavior from element to element are easily generated. For example, the results of an examination of variations in writing voltage from memory element to memory element (i.e., distribution of the programming voltage) in which a first conductive layer, an organic compound layer, and a second conductive layer are stacked, in order, will be described below. The dimensions of the memory elements used are 5 µm by 5 µm (hereinafter, expressed as $(5\,\mu m)^2$) and 10 µm by 10 µm (hereinafter, expressed as $(10\,\mu m)^2$). For the first conductive layer, titanium at a film thickness of 100 nm is used; for the organic compound layer, 4,4'-bis[N-(1-naphthyl)-N-phenylamino]biphenyl (abbreviated designation: NPB) at a film thickness of 10 nm is used; and for the second conductive layer, aluminum at a film thickness of 200 nm is used.

In the present experiment, a memory device formed of 64 memory elements, that is, a 64-bit memory device, was used. The accumulated programming ratio with respect to applied voltage is shown in FIG. 23.

From FIG. 23, in a memory device of whichever size, there are variations in the writing voltage of the memory element from element to element. As a result, a large difference is generated between the voltage when writing begins (in FIG. 23, 5 V) and the voltage when writing is completed (in FIG. 23, from 10 V to 15 V). In this type of case, because there is a need to set the writing voltage so that it matches the highest writing voltage required by the memory element, power consumption is increased. This means that the variations from pixel to pixel lead to an increase in power consumption.

In consideration of the aforementioned problem, the object of the present invention is to reduce variations in programming behavior of memory elements with motivation of producing a memory device and a semiconductor device equipped with the memory device having excellent writing characteristics.

One aspect of the present invention is a memory element that includes a first conductive layer, a metal oxide layer, a semiconductor layer, an organic compound layer, and a second conductive layer, where the metal oxide layer, the semiconductor layer, and the organic compound layer are interposed between the first conductive layer and the second conductive layer, the metal oxide layer is provided in contact with the first conductive layer, and the semiconductor layer is provided in contact with the metal oxide layer.

Another aspect of the present invention is a memory element that includes a first conductive layer, a metal oxide layer, a semiconductor layer, an organic compound layer, and a second conductive layer, where the metal oxide layer, the semiconductor layer, and the organic compound layer are interposed between the first conductive layer and the second conductive layer, the metal oxide layer is provided in contact with the first conductive layer, and the semiconductor layer is provided in contact with the second conductive layer.

In the above structures, the semiconductor layers may be discontinuous layers.

Furthermore, in the above structures, the metal oxide layer may be formed of an oxide material used in the first conductive layer. In this case, the metal oxide layer may be formed by oxidation of the surface of the first conductive layer. Oxidation processes include natural oxidation and the like, in addition to plasma treatment or heat treatment in the presence of oxygen.

In addition, in the above memory elements, the organic compound layers may each also have an insulator.

The organic compound layer of the memory element of the present invention is formed using an electron-transporting material or a hole-transporting material. Electrical characteristics of the memory elements are changed and writing of data is performed by application of a voltage. Electrical characteristics include, for example, resistance; while data is being written, a part of the first conductive layer and a part of the second conductive layer acting as a pair are connected, that is, short-circuited (hereinafter, also referred to as shorted). With this, a change in the amount of resistance occurs.

In addition, another aspect of the present invention is a semiconductor device in which a plurality of the memory elements is arranged in matrix. It is to be noted that each one of the plurality of the memory elements may be connected to a thin film transistor.

The abovementioned semiconductor device may include a third conductive layer that functions as an antenna and that is electrically connected to a memory element through a circuit.

There are no particular limitations on the level of the writing voltage as long as it is a voltage by which electrical characteristics of a memory element can be changed by application of the voltage between the first conductive layer and the second conductive layer. The applied voltage needed to substantially change the electrical characteristics of this memory element is designated as the writing voltage in the present specification. Writing of data is performed in this way using changes in the electrical characteristics of the memory element by application of a voltage. In addition, for the reading voltage, an applied voltage is used to read the difference between the electrical characteristics of an element to which data has been written and the electrical characteristics of an element to which data has not been written; however, there are no particular limitations on the level of the voltage at which electrical characteristics are not changed.

Moreover, in the present specification, the first conductive layer and second conductive layer are also referred to as electrodes.

By the present invention, memory elements in which variations in programming behavior from memory element to memory element can be reduced and that have excellent writing characteristics as well as a memory device that includes the memory elements and a semiconductor device equipped with the memory device can be obtained.

DETAILED DESCRIPTION OF THE INVENTION

Figure 1A:
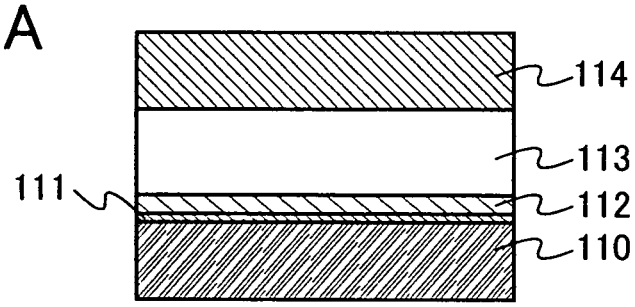
FIGS. 1A to 1C are diagrams each illustrating an example of a structure of a memory element of the present invention.

Hereinafter, Embodiment Modes and Embodiments of the present invention will be described using the drawings. However, the present invention is not limited to the description below, and it is to be easily understood by those skilled in the art that various changes and modifications can be made without any departure from the spirit and scope of the present invention. Accordingly, the present invention is not to be taken as being limited to the described content of the embodiment modes included herein. Note that, in structures of the present invention to be described below, there are cases in which the reference numerals denoting the same portions in different drawings are used in common.

Embodiment Mode 1

Figure 1B:
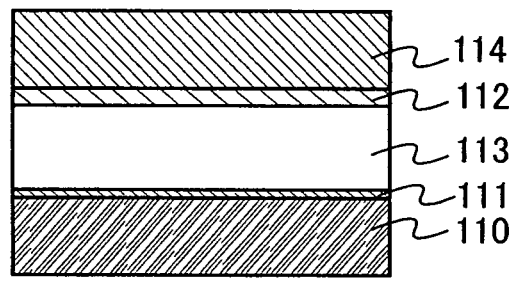
Figure 1C:
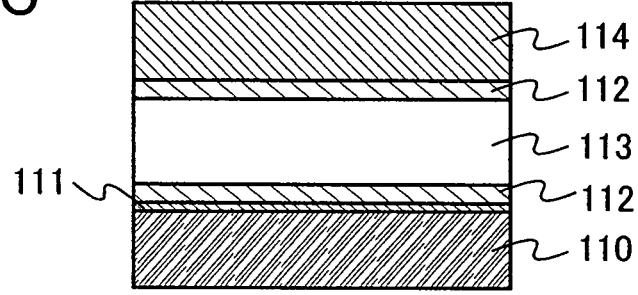

Examples of a structure of a memory element of the present invention are described using FIGS. 1A to 1C. The memory element shown in FIG. 1A includes a first conductive layer 110, a metal oxide layer 111, a semiconductor layer 112, an organic compound layer 113, and a second conductive layer 114. The structure is one in which the metal oxide layer 111, the semiconductor layer 112, and the organic compound layer 113 are interposed between the first conductive layer 110 and the second conductive layer 114. The metal oxide layer 111 is provided in contact with the first conductive layer 110, and the semiconductor layer 112 is provided in contact with the metal oxide layer 111.

For the first conductive layer 110 and the second conductive layer 114, a metal, an alloy, a compound, or the like with a high conductivity formed as a single-layer or stacked-layer structure can be used.

For example, indium tin oxide (hereinafter referred to as ITO), indium tin oxide that contains silicon, indium oxide that contains from 2 wt % to 20 wt % of zinc oxide (abbreviated designation: IZO), and the like can be given. In addition to transition metal elements such as titanium (Ti), gold (Au), platinum (Pt), nickel (Ni), tungsten (W), chromium (Cr), molybdenum (Mo), iron (Fe), cobalt (Co), copper (Cu), palladium (Pd), and the like and a nitride of a metallic material (for example, titanium nitride, tungsten nitride, or molybdenum nitride), metals from group 1 or group 2 of the periodic table of the elements, that is, alkali metals such as lithium (Li), cesium (Cs), and the like and alkaline earth metals such as magnesium (Mg), calcium (Ca), strontium (Sr), and the like, an alloy containing any of these metals (for example, MgAg and AlLi), and the like can be given. Furthermore, a rare earth metal such as europium (Er), ytterbium (Yb), or the like, an alloy of any of these metals, or the like may be used.

It is to be noted that the first conductive layer 110 may be formed using an evaporation method, a sputtering method, a CVD method, a printing method, an electroplating method, an electroless plating method, a spin coating method, or the like. In addition, a droplet discharge method can be used, as well. It is to be noted that the droplet discharge method is a method in which droplets containing a predetermined composition are discharged through pores and a pattern is formed.

The second conductive layer 114 can be formed using an evaporation method, a sputtering method, a CVD method, a printing method, or a droplet discharge method.

The organic compound layer 113 is formed of an organic compound whose crystallization state, conductivity, and shape are changed by application of a voltage from an external source. The shape of the organic compound layer 113 can also be changed by application of a voltage between the first and second conductive layers. The organic compound layer 113 may be formed as a single layer or as a plurality of layers where layers formed of different organic compounds are stacked together.

It is to be noted that the organic compound layer 113 is formed at a film thickness at which the electrical resistance of a memory element is changed by application of a voltage from an external source. Typical film thickness for the organic compound layer 113 is from 5 nm to 100 nm, preferably, from 10 nm to 60 nm.

For the metal oxide layer 111, a metal oxide such as titanium oxide, nickel oxide, tungsten oxide, chromium oxide, molybdenum oxide, iron oxide, cobalt oxide, copper oxide, palladium oxide, or the like can be used.

It is preferable that film thickness of the metal oxide layer 111 be greater than or equal to 0.1 nm and less than or equal to 25 nm, more preferably, greater than or equal to 0.1 nm and less than or equal to 15 nm.

The metal oxide layer 111 is formed, for example, by oxidation of the first conductive layer 110. For oxidation, in addition to plasma treatment or heat treatment performed in the presence of oxygen, natural oxidation and the like are also included. Alternatively, a metal film may be formed separately from the first conductive layer 110, and the metal oxide layer 111 may be formed by oxidation of this metal film. It is to be noted that, for this metal film, in addition to materials that can be used for the first conductive layer 110, a metal film with a low conductivity can be used. Furthermore, the metal oxide may be formed using an evaporation method, an electron beam deposition method, a sputtering method, a CVD method, or the like. In addition, for additional formation methods for a metal oxide, a spin coating method, a sol-gel method, a printing method, a droplet discharge method, or the like may be used, or a combination of any of the above methods with any of these methods may be used.

For the semiconductor layer 112, a semiconductor material such as molybdenum oxide, tin oxide, bismuth oxide, vanadium oxide, titanium oxide, iron oxide, chromium oxide, copper oxide, a manganese silicon oxide film, nickel oxide, zinc oxide, silicon-germanium, gallium arsenide, gallium nitride, indium oxide, indium phosphide, indium nitride, cadmium sulfide, cadmium telluride, a strontium titanate film, or the like can be used. It is to be noted that the semiconductor layer 112 need not necessarily be formed of one kind of semiconductor; a plurality of semiconductor materials may be mixed together to form the semiconductor layer 112. In addition, the semiconductor layer 112 may be provided as a single layer or as a plurality of layers where layers formed of different semiconductor layers are stacked together.

There are no particular limitations on the film thickness of the semiconductor layer 112 as long as the film thickness is 0.1 nm or more. For example, the film thickness may be less than 10 nm or greater than 10 nm.

The semiconductor layer 112 can be formed using an evaporation method, an electron beam deposition method, a sputtering method, a CVD method, or the like. In addition, for additional formation methods, a spin coating method, a sol-gel method, a printing method, a droplet discharge method, or the like may be used, or a combination of any of the above methods with any of these methods may be used.

The organic compound layer 113 may be formed using an organic compound that has a hole-transporting property or an electron-transporting property. It is to be noted that, here, a compound that has a hole-transporting property is not one that transports holes only; a compound that has a hole-transporting property refers to a compound which also has an electron-transporting property, however, the hole mobility is higher than the electron mobility. Similarly, a compound that has an electron-transporting property is not one that transports electrons only; a compound that has an electron-transporting property refers to a compound which also has a hole-transporting property, however, the electron mobility is higher than the hole mobility. Accordingly, a material that transports both holes and electrons is also included in these categories.

For example, for an organic material that has a hole-transporting property, an aromatic amine compound (that is, a material with a benzene ring-nitrogen bond) such as 2,7-di (N-carbazolyl)-spiro-9,9'-bifluorene (abbreviated designation: SFDCz), 4,4'-bis[N-(1-napthyl)-N-phenylamino]biphenyl (abbreviated designation: NPB), 4,4'-bis[N-(3-methylphenyl)-N-phenylamino]biphenyl (abbreviated designation: TPD), 4,4',4"-tris(N,N-diphenylamino)triphenylamine (abbreviated designation: TDATA), 4,4',4"-tris[N-(3-methylphenyl)-N-phenylamino]triphenylamine (abbreviated designation: MTDATA), 4,4'-bis(N-(4-(N,N-di-m-tolylamino)phenyl)-N-phenylamino)biphenyl (abbreviated designation: DNTPD), or the like; a phthalocyanine compound such as phthalocyanine (abbreviated designation: $H_2Pc$), copper phthalocyanine (abbreviated designation: CuPc), vanadyl phthalocyanine (abbreviated designation: VOPc), or the like; and the like can be given.

For an organic compound with a high electron-transporting property, a material formed of a metal complex or the like that has a quinoline skeleton or benzoquinoline skeleton, such as tris(8-quinolinolato)aluminum (abbreviated designation: Alq), tris(4-methyl-8-quinolinolato)aluminum (abbreviated designation: $Almq_3$), bis(10-hydroxybenzo[h]quinolinato) beryllium (abbreviated designation: $BeBq_2$), bis(2-methyl-8-quinolinolato)-4-phenylphenolato-aluminum (abbreviated designation: BAlq), and the like can be given. Furthermore, in addition to these, a material of a metal complex or the like that has an oxazole-based or thiazole-based ligand, such as bis[2-(2-hydroxyphenyl)benzoxazolato]zinc (abbreviated designation: $Zn(BOX)_2$), bis[2-(2-hydroxyphenyl)benzothiazolato] zinc (abbreviated designation: $Zn(BTZ)_2$), or the like can be used. Moreover, in addition to metal complexes, 2-(4-biphenylyl)-5-(4-tert-butylphenyl)-1,3,4-oxadiazole (abbreviated designation: PBD), 1,3-bis[5-(p-tert-butylphenyl)-1,3,4-oxadiazol-2-yl]benzene (abbreviated designation: OXD-7), 3-(4- biphenylyl)-4-phenyl-5-(4-tert-butylphenyl)-1,2,4-triazole (abbreviated designation: TAZ), 3-(4-tert-butylphenyl)-4-(4-ethylphenyl)-5-(4-biphenylyl)-1,2,4-triazole (abbreviated designation: p-EtTAZ), bathophenanthroline (abbreviated designation: BPhen), bathocuproine (abbreviated designation: BCP), and the like can be given.

In addition to the above, for example, the organic compound layer 113 may be formed using 2,3-bis(4-diphenylaminophenyl)quinoxaline (abbreviated designation: TPAQn), 1,3,5-tri(N-carbazolyl)benzene (abbreviated designation: TCzB), 9-[4-(N-carbazolyl)phenyl]-10-phenylanthracene (abbreviated designation: CzPA), 3,6-diphenyl-9-[4-(10-phenyl-9-anthryl)phenyl]-9H-carbazole (abbreviated designation: DPCzPA), 2-t-butyl-9,10-bis(4-(N-carbazolyl)phenyl)anthracene (abbreviated designation: CzBPA), 3-[N-(9-phenylcarbazol-3-yl)-N-phenylamino]-9-phenylcarbazole (abbreviated designation: PCzPCA1), 3,6-bis[N-(9-phenylcarbazol-3-yl)-N-phenylamino]-9-phenylcarbazole (abbreviated designation: PCzPCA2), 3-[N-(1-naphthyl)-N-(9-phenylcarbazol-3-yl)amino]-9-phenylcarbazole (abbreviated designation: PCzPCN1), 4,4'-di(N-carbazolyl)biphenyl (abbreviated designation: CBP), 1,3,5-tris[4-(N-carbazolyl)phenyl]benzene (abbreviated designation: TCPB), N-(2-naphthyl)carbazole (abbreviated designation: NCz), or the like.

The organic compound layer 113 can be formed using an evaporation method, an electron-beam deposition method, a sputtering method, a CVD method, or the like. In addition, for alternative methods, a spin coating method, a sol-gel method, a printing method, a droplet discharge method, or the like may be used, or a combination of any of the above methods with any of these methods may be used.

In addition, for the organic compound layer 113, an insulator may be mixed into the organic compound that has a hole-transporting property or electron-transporting property. It is to be noted that the insulator need not be evenly dispersed throughout the organic compound. By mixing of the insulator into the organic compound, the morphology of the organic compound layer 113 can be improved. Consequently, because the partial crystallization of a film can be suppressed, variations in programming behavior from memory element to memory element can be suppressed, as well.

An inorganic compound or organic compound that has an insulating property can be used for the insulator. For example, for an inorganic compound that has an insulating property, an oxide such as lithium oxide, sodium oxide, potassium oxide, rubidium oxide, beryllium oxide, magnesium oxide, calcium oxide, strontium oxide, barium oxide, and the like; a fluoride such as lithium fluoride, sodium fluoride, potassium fluoride, rubidium fluoride, beryllium fluoride, magnesium fluoride, calcium fluoride, strontium fluoride, barium fluoride, and the like; a nitride, a chloride, a bromide, an iodide, a carbonate, a sulfate, or a nitrate with an insulating property; and the like can be given. Furthermore, for an organic compound that has an insulating property, a polyimide, an acrylic polymer, a polyamide, benzocyclobutene-based resin, a polyester, a novolac resin, a melamine resin, a phenol resin, an epoxy resin, a silicone resin, a furan resin, a diallyl phthalate resin, or the like can be used. In addition, a so-called siloxane material formed with a main chain having a bond of silicon and oxygen may also be used.

It is to be noted that this kind of mixed layer can be formed by film formation of a plurality of materials simultaneously; for example, the materials can be formed by the same method or a combination of different methods such as by a co-evaporation method by resistive heating, a co-evaporation method by electron-beam deposition, a co-evaporation method by resistive heating evaporation and electron-beam deposition, film formation by resistive heating evaporation and a sputtering method, film formation by electron-beam deposition and a sputtering method, or the like. Furthermore, for alternative formation methods, a spin coating method, a sol-gel method, a printing method, a droplet discharge method, or the like may be used, or one or more of these (methods) may be combined with any of the above methods. Alternatively, films of an organic compound and an insulator are not formed simultaneously; instead, the mixed layer of the organic compound and insulator may be formed where, after the organic compound layer is formed, an insulator is introduced into the organic compound by an ion injection method, a doping method, or the like.

For a memory element with a structure like the one described above, by provision of the metal oxide layer and semiconductor layer in contact with the first conductive layer, the localization of the electric field on the surface of the conductive layer can be suppressed.

By the above methods, reducing the variations in programming behavior from memory element to memory element becomes possible, and a memory element with excellent writing characteristics can be obtained.

Figure 16A:
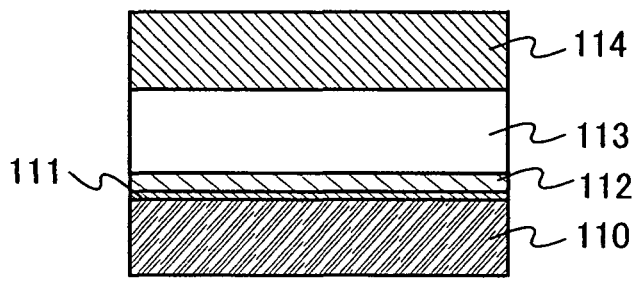
FIGS. 16A to 16C are diagrams used to show an operation mechanism of a memory element of the present invention.
Figure 16B:
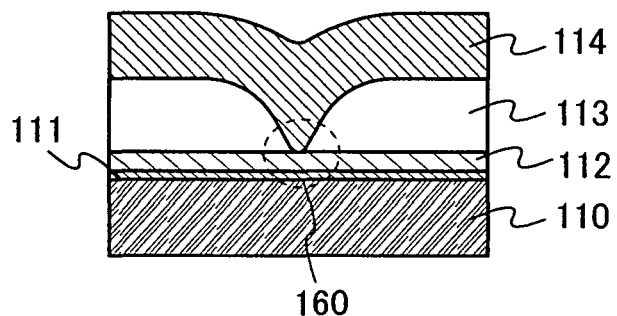
Figure 16C:
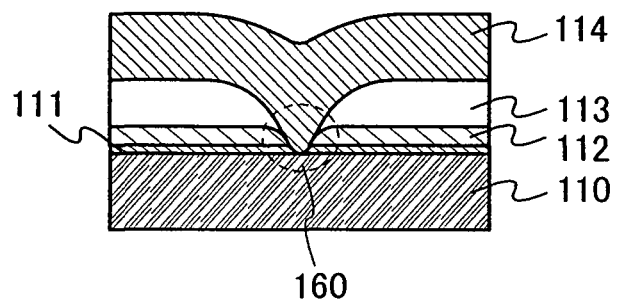

Next, an operation mechanism of the memory element will be described using FIGS. 16A to 16C. First, a drawing showing the memory element before voltage is applied is shown in FIG. 16A. When voltage is applied between the first conductive layer 110 and the second conductive layer 114, carriers are injected into the semiconductor layer 112 and the organic compound layer 113 from the first conductive layer 110 through the metal oxide layer 111; at the time when the applied voltage reaches a certain value, the organic compound layer 113 is transformed. Herewith, at least a part of the second conductive layer 114 comes into contact with the semiconductor layer 112 and the first conductive layer 110, and as a result, the memory element is short-circuited (refer to reference numeral 160 in FIGS. 16B and 16C). In this way, the resistance of the memory element is changed from before and after voltage is applied.

From an operation mechanism like the one described above, writing of data is performed using the change in the resistance of the memory element by application of a voltage.

Furthermore, the structure of the memory element is not limited to the structure shown in FIG. 1A but may be a structure, like the one shown in FIG. 1B, in which the metal oxide layer 111 is provided in contact with the first conductive layer 110 and the semiconductor layer 112 is provided in contact with the second conductive layer 114. In addition, as shown in FIG. 1C, the metal oxide layer 111 in contact with the first conductive layer 110 and one semiconductor layer 112 may be stacked, in order, and another semiconductor layer 112 may be provided so as to come into contact with the second conductive layer 114.

Figure 2A:
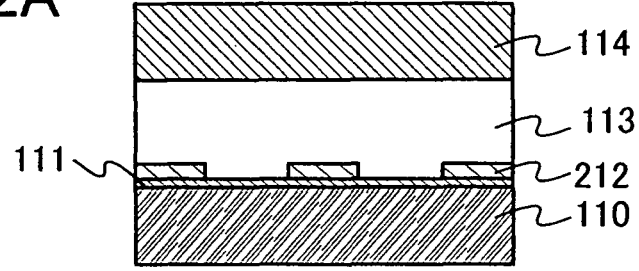
FIGS. 2A and 2B are diagrams each illustrating an example of a structure of a memory element of the present invention.

Moreover, for the shape of the semiconductor layer 112, the semiconductor layer 112 need not be a continuous layer as shown in FIGS. 1A to 1C but may be a discontinuous layer. For example, the semiconductor layer can be formed as a striped discontinuous layer like a semiconductor layer 212 shown in FIG. 2A. It is to be noted that there are no particular limitations on the orientation of the stripes of the semiconductor layer 212. Because the localization of the electric field on the surface of the first conductive layer can be suppressed even if the semiconductor layer 112 is a discontinuous layer, an effect similar to the one above can be obtained.

Figure 2B:
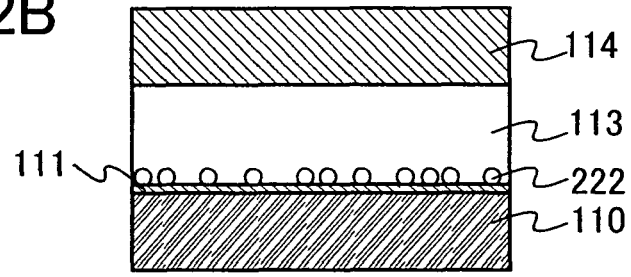

Furthermore, the semiconductor layer 112 may be formed as particles 222 as shown in FIG. 2B. There are no particular limitations on the particle diameter of the particles 222.

Figure 3A:
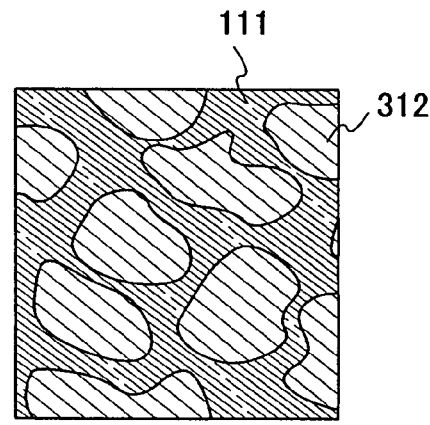
FIGS. 3A to 3C are diagrams each illustrating an example of a structure of a memory element of the present invention.
Figure 3B:
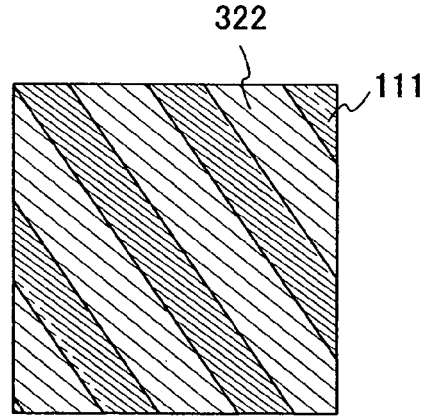
Figure 3C:
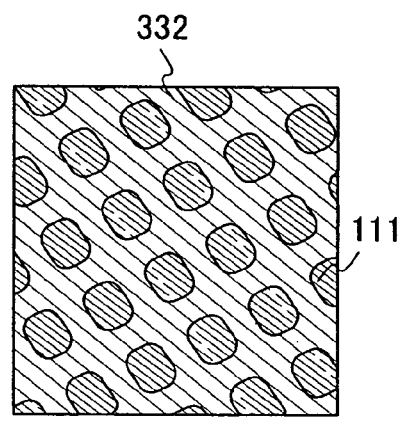

Moreover, the shape of the semiconductor layer 112 may be any of the shapes shown in FIGS. 3A to 3C. It is to be noted that FIGS. 3A to 3C are top-view diagrams, and the semiconductor layers are represented by reference numerals 312, 322, and 332.

As shown in FIG. 3A, the semiconductor layer 312 covers at least part of the first conductive layer 110 with the metal oxide layer interposed between the semiconductor layer 312 and the first conductive layer 110, and the semiconductor layer 312 can be formed into island-shaped discontinuous layers. Here, the semiconductor layer 312 formed into a plurality of discontinuous layers is unevenly distributed over the first conductive layer 110 with the metal oxide layer 111 interposed between the semiconductor layer 312 and the first conductive layer 110.

In addition, as shown in FIG. 3B, the semiconductor layer 322 formed over the first conductive layer 110 with the metal oxide layer 111 interposed between the semiconductor layer 322 and the first conductive layer 110 can be formed as striped discontinuous layers that are arranged at a given angle (an angle greater than or equal to −90° and less than 90°) with respect to any one of the sides of the first conductive layer 110.

Furthermore, as shown in FIG. 3C, the semiconductor layer 332 formed over the first conductive layer 110 with the metal oxide layer 111 interposed between the semiconductor layer 332 and the first conductor 110 can be formed into reticular-shaped discontinuous layers.

It is to be noted that the semiconductor layer need not be just one layer but may be formed as a stacked-layer structure. Moreover, each layer of these stacked semiconductor layers can be formed into any of the aforementioned shapes.

For the voltage applied to the memory element of the present invention, a higher voltage may be applied to the first conductive layer 110 than to the second conductive layer 114, or a higher voltage may be applied to the second conductive layer 114 than to the first conductive layer 110.

By formation of the memory element into a structure like any of the structures above, reducing variations in programming behavior from memory element to memory element becomes possible, and a memory element with excellent writing characteristics can be obtained. Furthermore, because the memory element of the present invention is one in which data cannot be erased once writing to the memory element has been performed, forgery performed by rewriting of data can be prevented. Moreover, because the memory element of the present invention has a simple structure in which a metal oxide layer, a semiconductor layer, and an organic compound layer are interposed between a pair of conductive layers, manufacturing a memory element that has excellent writing characteristics at low cost comes to be possible.

Embodiment 2

In the present embodiment mode, a semiconductor device that includes the memory element of the present invention, typically, a memory device, will be described using drawings. Here, the case for when the structure of the memory device is a passive matrix type is presented.

Figure 4A:
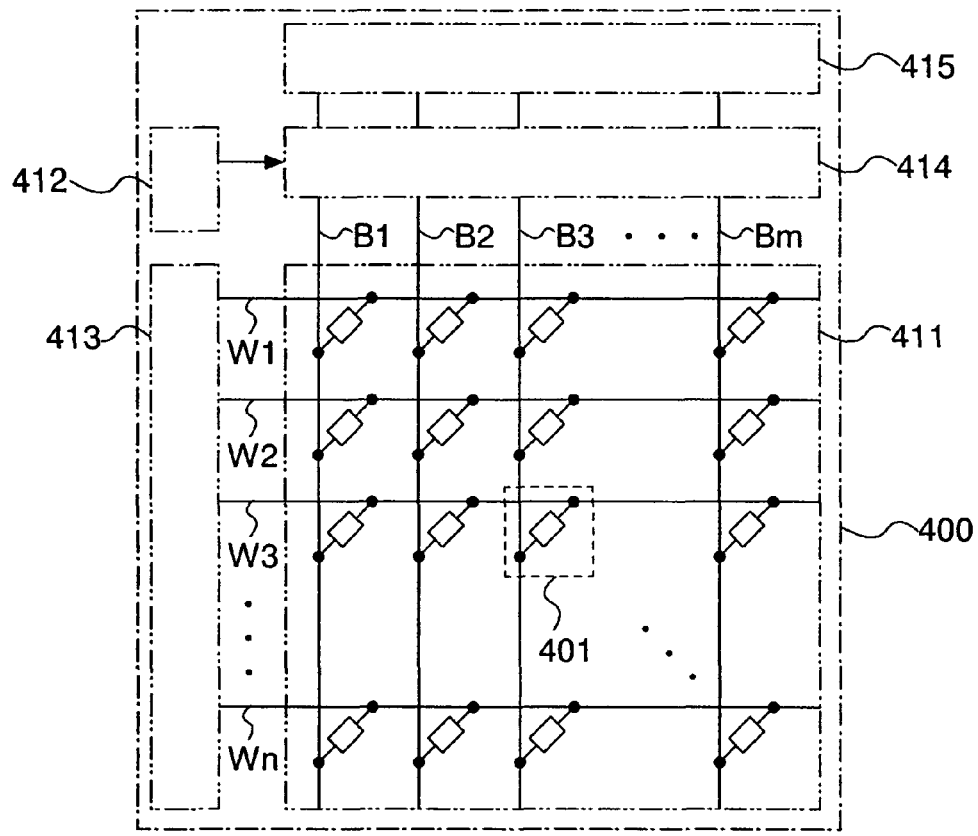
FIGS. 4A to 4C are diagrams each illustrating an example of a structure of a semiconductor device of the present invention.

An example of a structure of the semiconductor device presented in the present embodiment mode is shown in FIG. 4A. A semiconductor device 400 has a memory cell array 411 in which memory elements 401 are provided in matrix, decoders 412 and 413, a selector 414, and a reading/writing circuit 415. It is to be noted that the structure of the semiconductor device 400 shown here is merely one example, and the semiconductor device may also have other circuits such as a sense amplifier, an output circuit, a buffer, and the like.

It is to be noted that the decoders 412 and 413, the selector 414, the reading/writing circuit 415, an interface, and the like may be formed over the same substrate as the memory elements or formed externally as IC chips.

Each memory element 401 has a first conductive layer connected to a word line $W_y$ ($1 \leq y \leq n$), a second conductive layer connected to a bit line $B_x$ ($1 \leq x \leq m$), a metal oxide layer that comes into contact with the first conductive layer, and a semiconductor layer and an organic compound layer formed over the metal oxide layer.

Figure 5A:
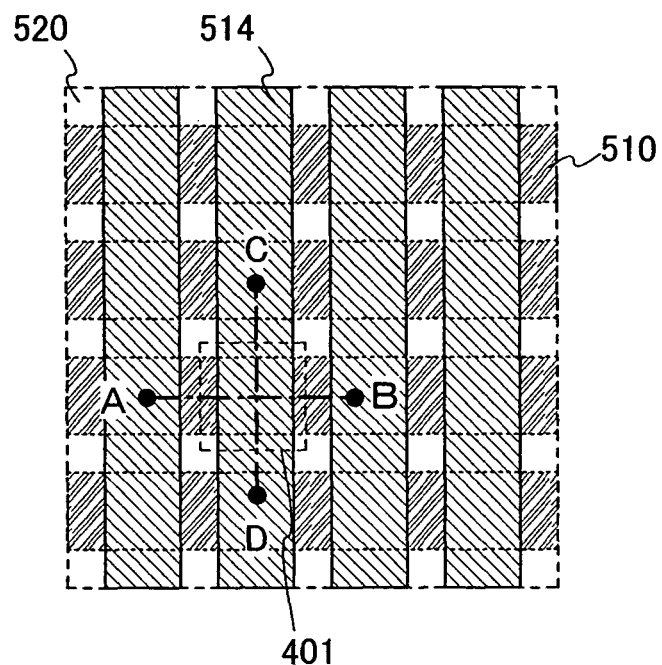
FIGS. 5A and 5B are diagrams each illustrating a memory cell included in a semiconductor device of the present invention.
Figure 5B:
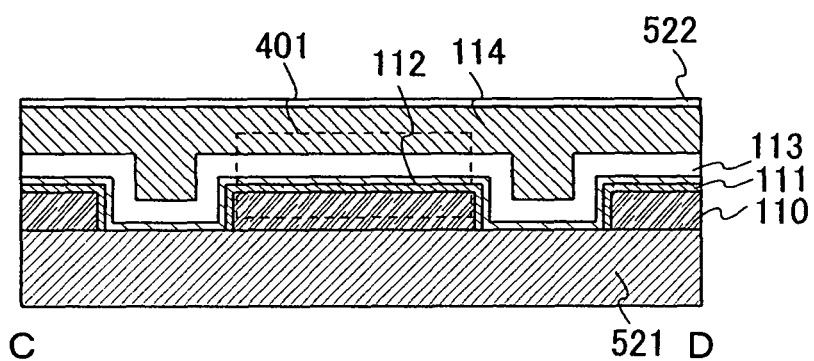

A top-view diagram and a cross-sectional view diagram of an example of the memory cell array 411 are shown in FIG. 5A and FIG. 5B, respectively. A top view of part of the memory cell array 411 is shown in FIG. 5A.

In the memory cell array 411, the memory elements 401 are provided in matrix. The memory element 401 has, over a substrate, a first conductive layer 510 extending in a first direction (A-B); a metal oxide layer, a semiconductor layer, and an organic compound layer 520 that cover the first conductive layer 510; and a second conductive layer 514 extending in a second direction (C-D) that is perpendicular to the first direction. Each of the layers used in each memory element 401 can be formed using any of the materials described in Embodiment Mode 1. In FIG. 5A, an insulating layer that functions as a protective film and is provided so as to cover the second conductive layer 514 is omitted.

It is to be noted that the first conductive layer 510 in the present embodiment mode corresponds to the first conductive layer 110 in Embodiment Mode 1, and each of the metal oxide layer, semiconductor layer, and organic compound layer 520 corresponds to the metal oxide layer 111, the semiconductor layer 112, and the organic compound layer 113, respectively. In addition, the second conductive layer 514 in the present embodiment mode corresponds to the second conductive layer 114 in Embodiment Mode 1. The same parts as those used in Embodiment Mode 1 are indicated using common reference numerals, and detailed descriptions of the same parts or parts with similar functions will be omitted.

An example of a cross-sectional structure taken along C-D in FIG. 5A is shown in FIG. 5B. For a substrate 521 over which the memory elements 401 are provided, in addition to a glass substrate or a flexible substrate, a quartz substrate, a silicon substrate, a metal substrate, a stainless steel substrate, paper formed of a fibrous material, or the like can be used. A flexible substrate is a substrate that can be bent (is flexible), and, for example, a plastic substrate, or the like, formed of a polycarbonate, a polyarylate, polyethersulfone, a polyester, or the like can be given. Moreover, a film (formed of a polypropylene, a polyester, poly(vinyl fluoride), poly(vinyl chloride), or the like) can also be used.

Furthermore, a thin film transistor (TFT) may be formed over a substrate that has an insulating property, and the memory elements 401 may be formed over the thin film transistor; alternatively, a field effect transistor (FET) may be formed on a semiconductor substrate of Si or the like or an SOI substrate used instead of the aforementioned substrate, and the memory elements 401 may be formed over the field effect transistor. The memory elements 401 may be provided by being affixed to the thin film transistor or field effect transistor, as well. In this case, the memory element portion and thin film transistor or field effect transistor are fabricated in different steps, and, after each is formed, the memory element portion and thin film transistor or field effect transistor are provided by being bonded together by use of a conductive film, anisotropic conductive adhesive, or the like.

In FIG. 5B, first, the first conductive layer 110 is formed over the substrate 521 using an evaporation method, a sputtering method, a CVD method, a printing method, an electroplating method, an electroless plating method, a droplet discharge method, or the like. Next, the metal oxide layer 111 is formed over the first conductive layer 110 by oxidation of the first conductive layer 110 by plasma treatment, heat treatment, or the like in the presence of oxygen. The metal oxide layer 111 may be formed by natural oxidation of the first conductive layer 110, as well. Of course, the metal oxide layer 111 may be formed by oxidation of a metal film formed separately from the first conductive layer 110. Alternatively, a metal oxide layer may be directly formed over the first conductive layer 110 by evaporation or sputtering of the metal oxide, or by application or droplet discharge of a solution or dispersion of the metal oxide. The metal oxide layer may also be formed by a sol-gel technique using a metal alkoxide. Next, over the metal oxide layer 111, the semiconductor layer 112 and the organic compound layer 113 are formed, in order, using an evaporation method, an electron-beam deposition method, a sputtering method, a CVD method, or the like. Moreover, for additional formation methods, a spin coating method, a sol-gel method, a printing method, a droplet discharge method, or the like may be used, or any of these methods may be combined with any of the above methods. Furthermore, the second conductive layer 114 is formed over the organic compound layer 113 using an evaporation method, a sputtering method, a CVD method, a printing method, or a droplet discharge method. After that, an insulating layer 522 that functions as a protective film is formed so as to cover the second conductive layer 114.

Figure 6A:
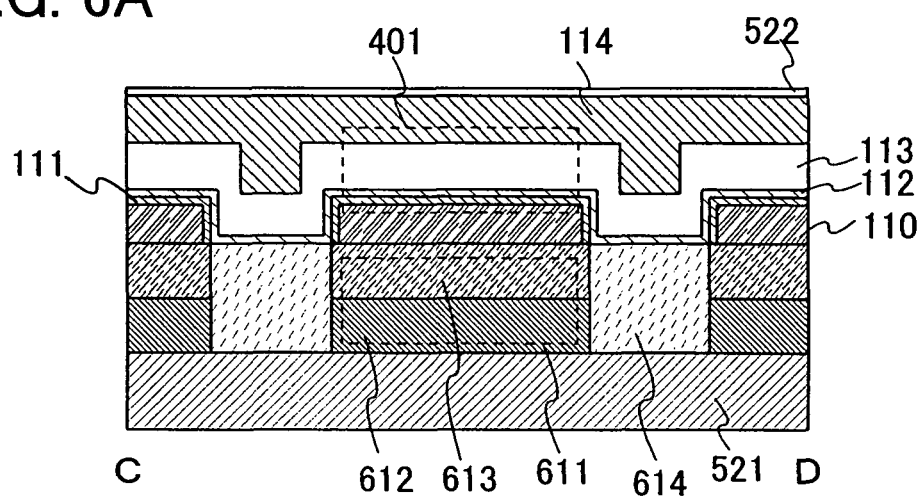
FIGS. 6A and 6B are diagrams each illustrating an example of a structure of a memory element of the present invention.

As shown in FIG. 6A, an element with a rectifying property may be provided in each memory element 401. For an element with a rectifying property, in addition to a Schottky-barrier diode, a PIN diode, and a PN diode, a diode-connected transistor and the like can be given. Here, a diode 611 formed of a third conductive layer 612 and a semiconductor layer 613 is provided under the first conductive layer 110 and in contact with the first conductive layer 110. It is to be noted that the diode 611 corresponding to each memory element is isolated by an interlayer insulating film 614. Furthermore, the element with a rectifying property may be provided on the side opposite from the organic compound layer 113 with the second conductive layer 114 interposed between the element with a rectifying property and the organic compound layer 113.

In addition, when there is concern about current leakage to neighboring memory elements, in order to separate the organic compound layer provided in each memory element from organic compound layers in other memory elements, a partition wall (an insulating layer) may be provided between the organic compound layers formed in neighboring memory elements. That is, the organic compound layer in each memory element may be electrically separated from those of other memory elements.

Figure 6B:
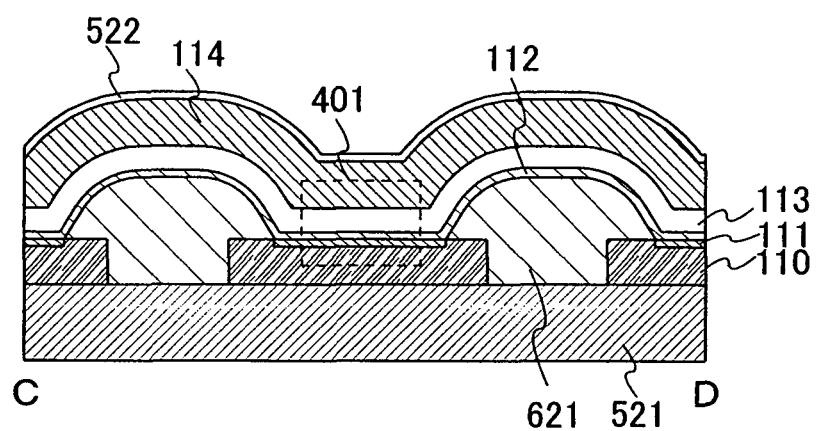

In addition, as shown in FIG. 6B, a partition wall (an insulating layer) 621 may be provided between the first conductive layers 110 of neighboring memory elements 401. Herewith, not only can current leakage to neighboring memory elements be prevented, but the discontinuity of these layers that results from differences in the height of the first conductive layer 110 on provision of the semiconductor layer 112 and organic compound layer 113 covering the first conductive layer 110 and the metal oxide layer 111 can be prevented, as well. It is to be noted that, in a cross section of a partition wall (insulating layer) 621, it is preferable that the side surfaces of the partition wall (insulating layer) 621 each be inclined at an angle of inclination greater than or equal to 10° and less than 60°, more preferably, greater than or equal to 25° and less than or equal to 45°, with respect to the surface of the first conductive layer 110. Moreover, curvature is preferable. After the partition wall (insulating layer) 621 is formed in this way, the semiconductor layer 112, the organic compound layer 113, and the second conductive layer 114 are formed so as to cover the metal oxide layer 111 and the partition wall (insulating layer) 621. The metal oxide layer 111 can be formed by oxidation of the surface of the first conductive layer 110 as described above. It is to be noted that the metal oxide layer 111 may be formed by oxidation of the surface of the first conductive layer 110 using plasma treatment in the presence of oxygen, for example, a resist ashing step or the like, included in the step for forming the partition wall (insulating layer) 621. Of course, the metal oxide layer may be formed by oxidation by heat treatment or by natural oxidation or formed by oxidation of a metal film formed separately, as well. In addition, the present invention is not limited to the structure described above, and the partition wall (insulating layer) 621 may be formed after the metal oxide layer 111 is formed over the first conductive layer 110 or after the metal oxide layer 111 and the semiconductor layer 112 are formed over the first conductive layer 110.

Next, an operation for writing of data to the memory element (i.e., programming operation) will be described. Here, the case for when writing of data is performed by an electrical operation, typically, by application of a voltage, will be described using FIGS. 4A to 4C. It is to be noted that writing is performed by changes in the electrical characteristics of the memory element; the initial state (a state in which an electrical operation has not been performed) of the memory element is set to be data of [0], and the state in which the electrical characteristics have been changed is set to be data of [1].

When data of [1] is written to each memory element 401, first, the memory element 401 is selected by the decoders 412 and 413 and the selector 414. Specifically, a given potential V2 is applied to a word line W3 connected to the memory element 401 by the decoder 413. In addition, a bit line B3 connected to the memory element 401 is connected to the reading/writing circuit 415 by the decoder 412 and the selector 414. Then, a writing potential V1 is output to the bit line B3 by the reading/writing circuit 415. In this way, a voltage Vw=V1−V2 is applied between the first conductive layer and the second conductive layer included in the memory element 401. By selection of a suitable voltage for the voltage Vw, properties of a layer that contains an organic compound and is provided between the conductive layers are changed physically or electrically, and writing of data of [1] is performed. Specifically, for the voltage of the reading operation, the electrical resistance between the first conductive layer and the second conductive layer for the state of data of [1], is changed so as to be dramatically decreased compared to the electrical resistance for the state of data of [0]; for example, the first conductive layer and the second conductive layer may be short-circuited (shorted out). It is to be noted that the potentials V1 and V2 should be selected, as suitable, from the range of (V1, V2)=(0 V, from 5 V to 15 V) or (V1, V2)=(from 3 V to 5 V, from −12 V to −2 V). The voltage V2 may be greater than or equal to 5 V and less than or equal to 15 V or greater than or equal to −15 V and less than or equal to −5 V.

Non-selected word lines and non-selected bit lines are controlled so that data of [1] is not written to memory elements connected to the non-selected word lines and non-selected bit lines. For example, the non-selected word lines and non-selected bit lines may each be placed in a floating state.

On the other hand, when data of [0] is written to the memory cell 401, an electrical operation is not to be performed on the memory element 401. For the circuit operation, for example, similar to when data of [1] is written, the memory element 401 is selected by the decoders 412 and 413 and the selector 414; however, an output potential output from the reading/writing circuit 415 to the bit line B3 may be set to be equivalent to the potential of the selected word line W3 or the potential of unselected word lines, and a voltage (for example, greater than or equal to −5 V and less than or equal to 5 V) of a level of which the electrical characteristics of the memory element 401 do not change may be applied between the first conductive layer and the second conductive layer included in the memory element 401.

Figure 4B:
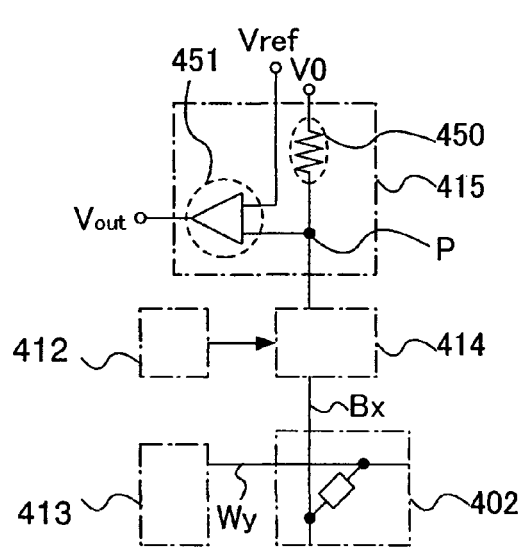
Figure 4C:
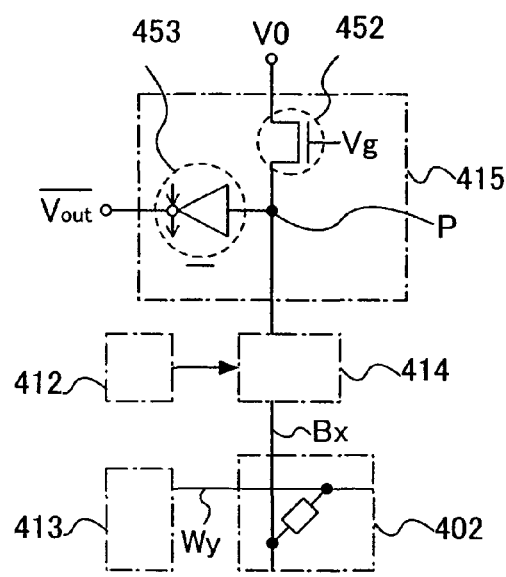

Subsequently, an operation performed for reading of data from the memory element is performed will be described using FIG. 4B. Reading of data is performed using the difference in electrical characteristics between the first conductive layer and the second conductive layer for a memory element with data of [0] and for a memory element with data of [1]. For example, a reading method will be explained that uses the difference in electrical resistance where the effective electrical resistance between the first conductive layer and the second conductive layer of the memory element with data of [0] (hereinafter, simply referred to as the electrical resistance of the memory element) is defined as R0 at the reading voltage and the electrical resistance of the memory element with data of [1] is defined as R1 at the reading voltage. It is to be noted that R1 is set to be much less than R0, or R1<<R0. For the reading/writing circuit 415, in the structure of the reading portion, for example, the circuit shown in FIG. 4B that has a resistor 450 and a differential amplifier 451 can be used. The resistor 450 has a resistance of Rr, where R1<Rr<R0. In addition, as shown in FIG. 4C, in exchange for the resistor 450, a transistor 452 may be used, and a clocked inverter 453 can be used in exchange for the differential amplifier 451. In the clocked inverter 453, when reading is performed, the voltage comes to be High, when reading is not performed, the voltage comes to be Low, and a signal $\phi$ or an inverse signal thereof is input, accordingly. Of course, the circuit structure is not limited to those shown in FIGS. 4B and 4C.

When reading of data from a memory element 402 is performed, first, the memory element 402 is selected by the decoders 412 and 413 and the selector 414. Specifically, a predetermined potential Vy is applied to a word line Wy, which is connected to the memory element 402, by the decoder 413. In addition, a bit line Bx connected to the memory element 402 is connected to a terminal P of the reading/writing circuit 415 by the decoder 412 and the selector 414. As a result, a potential Vp of the terminal P comes to be a value determined by resistor divider where the resistance of the resistor 450 (resistance of Rr) and the memory element 402 (resistance of R0 or R1) are determined by Vy and V0. Accordingly, when the memory element 402 has data of [0], a potential Vp0 of the terminal P becomes Vp0=Vy+(V0−Vy)×R0/(R0+Rr). Furthermore, when the memory element 402 has data of [1], a potential Vp1 of the terminal P becomes Vp1=Vy+(V0−Vy)×R1/(R1+Rr). As a result, in FIG. 4B, by selection of a Vref whose value falls between Vp0 and Vp1, or by selection of a point of change of the clocked inverter 453 in FIG. 4C that comes to be between Vp0 and Vp1, an output potential Vout outputs Low/High (or High/Low) in response to data of [0]/[1], and reading can be performed.

For example, the differential amplifier 451 operates at Vdd=3 V, and the following are set: Vy=0 V, V0=3 V, and Vref=1.5 V. Assuming that R0/Rr=Rr/R1=9, when the data of the memory element is [0], Vp0 becomes 2.7 V, Vp0=2.7 V, and Vout is output as a High; when the data of the memory element is [1], Vp1 becomes 0.3 V, Vp1=0.3 V, and Vout is output as a Low. In this way, reading of data of the memory element can be performed.

By the above method, for the state of the electrical resistance of the layer that contains an organic compound, the amount of voltage is read using the difference in resistance and by resistor divider. Of course, the reading method is not limited to this method. For example, other than use of the difference in resistance, reading may be performed using the difference in current. Alternatively, when the electrical characteristics of the memory cell include diode characteristics in which the threshold voltage varies for data of "0" and for data of "1," reading of data may be performed using the difference in threshold voltages.

In addition, a memory element or memory element array may be formed over a thin film transistor that is formed over an insulating substrate, or the memory element or memory element array may be formed over a field effect transistor (FET) formed on a semiconductor substrate of Si or the like or an SOI substrate used instead of the insulating substrate.

In the semiconductor device presented in the present embodiment mode, by use of memory elements of the present invention in the semiconductor device, variations in programming behavior from memory element to memory element can be reduced. For this reason, a semiconductor device with excellent writing characteristics can be fabricated. In addition, an increase in writing voltage can be prevented, and the margin for reading voltage can be widened. Consequently, the amount of freedom in design of the semiconductor device can be increased.

Furthermore, not only is data written to the semiconductor device just once, but additional data (appended data) can also be written to the semiconductor device while memory elements to which data has not been written still remain. On the other hand, because data cannot be erased once writing to the memory element has been performed, forgery due to rewriting of data can be prevented. Moreover, because the memory element of the present invention is one that has a simple structure in which a metal oxide layer, a semiconductor layer, and an organic compound layer are interposed between a pair of conductive layers, a semiconductor device with excellent writing characteristics can be manufactured at low cost.

It is to be noted that the present embodiment mode can be freely combined with any of the other embodiment modes and embodiments.

Embodiment Mode 3

In the present embodiment mode, a semiconductor device that has a memory element of the present invention will be described using FIGS. 7A to 7C. It is to be noted that, specifically, an active matrix memory device will be described.

Figure 7A:
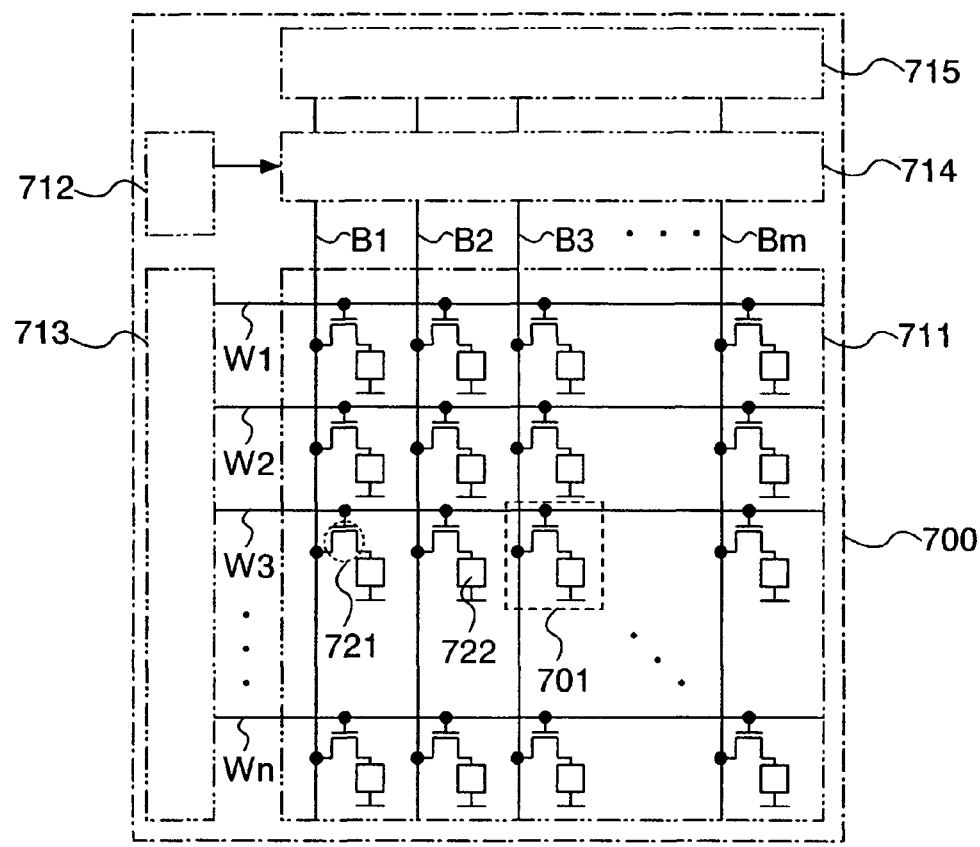
FIGS. 7A to 7C are diagrams each illustrating an example of a structure of a semiconductor device of the present invention.
Figure 7B:
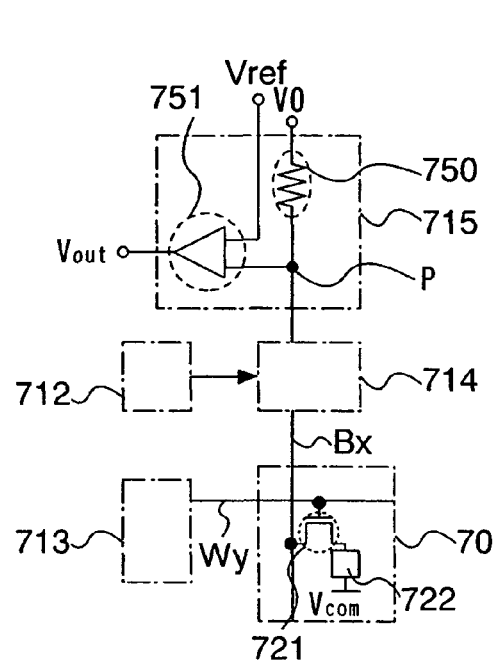
Figure 7C:
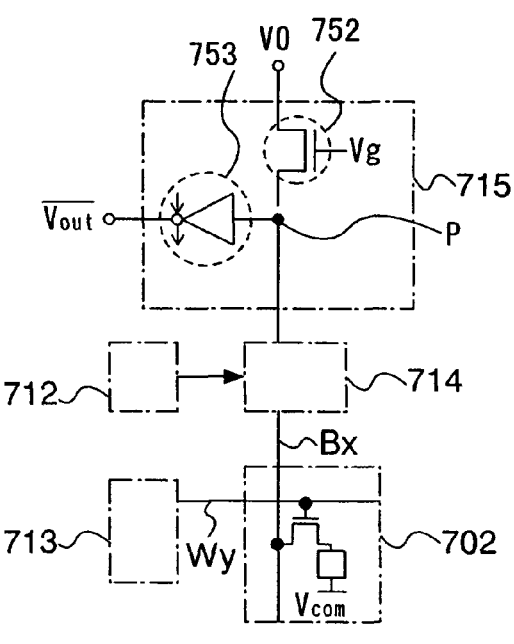

An example of a structure of a semiconductor device presented in the present embodiment mode is shown in FIG. 7A. A semiconductor device 700 has a memory cell array 711 in which memory cells 701 are provided in matrix, decoders 712 and 713, a selector 714, and a reading/writing circuit 715. It is to be noted that the structure of the semiconductor device 700 shown here is merely one example, and the semiconductor device may also have additional circuits such as a sense amplifier, an output circuit, a buffer, and the like.

It is to be noted that the decoders 712 and 713, the selector 714, the reading/writing circuit 715, an interface, and the like may be formed over the same substrate as a memory element or formed externally as IC chips.

The memory cell 701 has a first wiring that is connected to a bit line Bx (1≤x≤m), a second wiring that is connected to a word line Wy (1≤y≤n), a thin film transistor 721, and a memory element 722. The memory element 722 has a structure in which a metal oxide layer, a semiconductor layer, and an organic compound layer are interposed between a pair of conductive layers.

Next, a top-view diagram and cross-sectional view diagrams of an example of the memory cell array 711 with the above structure will be described using FIGS. 8A to 8C. A top-view diagram of a part of the memory cell array 711 is shown in FIG. 8A.

In the memory cell array 711, a plurality of the memory cells 701 are arranged in matrix. In addition, in each memory cell 701, the thin film transistor 721 that functions as a switching element and a memory element connected to the thin film transistor 721 are provided over a substrate that has an insulating surface.

Figure 8A:
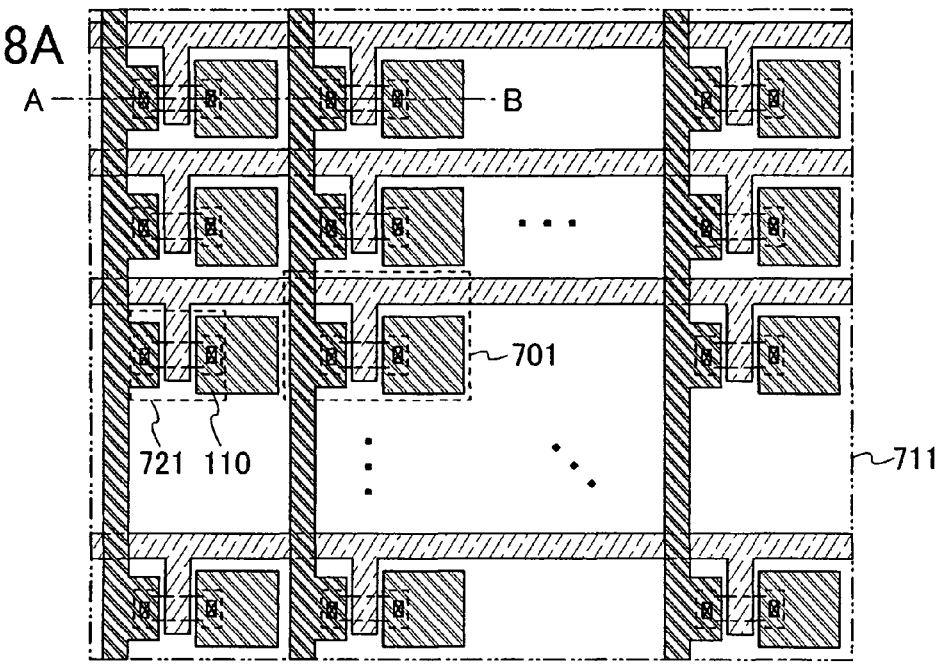
FIGS. 8A to 8C are diagrams each illustrating a memory cell included in a semiconductor device of the present invention.
Figure 8B:
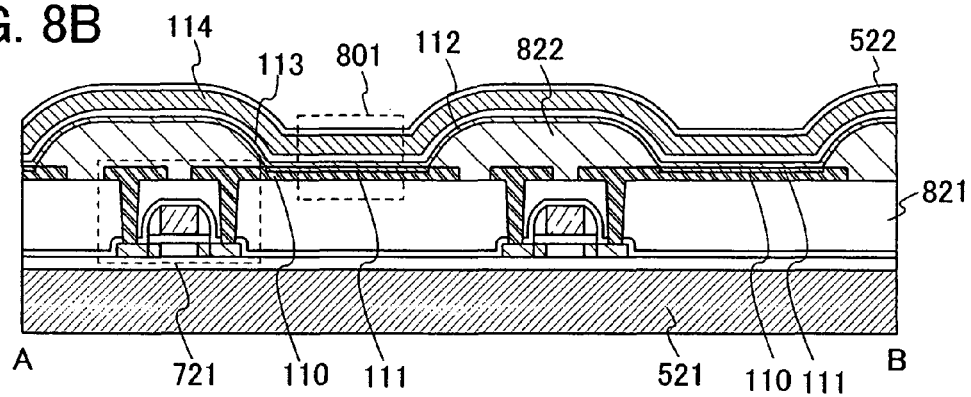

A cross-sectional structure taken along A-B in FIG. 8A is shown in FIG. 8B. It is to be noted that a metal oxide layer 111, a partition wall (insulating layer) 822, a semiconductor layer 112, an organic compound layer 113, a second conductive layer 114, and an insulating layer 522, which are all provided over a first conductive layer 110, are omitted from FIG. 8A.

The memory cell 701 has the thin film transistor 721, a memory element 801, an insulating layer 821, and a partition wall (insulating layer) 822 that covers a part of the first conductive layer 110. It is to be noted that an insulating layer 522 that functions as a protective film covering the memory element 801 is provided. The memory element 801 connected to the thin film transistor 721 formed over a substrate 521 that has an insulating surface includes, formed over the insulating layer 821, the first conductive layer 110, the metal oxide layer 111, the semiconductor layer 112, the organic compound layer 113, and the second conductive layer 114. The metal oxide layer 111 can be formed by oxidation of a surface of the first conductive layer 110 as described above. It is to be noted that the metal oxide layer 111 may be formed using plasma treatment in the presence of oxygen, for example, a resist ashing step or the like, included in the step for forming the partition wall (insulating layer) 822. Of course, the metal oxide layer may be formed by oxidation by heat treatment or by natural oxidation or formed by oxidation of a metal film formed separately, as well. In addition, the structure is not limited to the structure described above, and the partition wall (insulating layer) 822 may be formed after the metal oxide layer 111 is formed over the first conductive layer 110 or after the metal oxide layer 111 and the semiconductor layer 112 are formed over the first conductive layer. It is to be noted that, in the present embodiment mode, the thin film transistor 721 is provided in each element; however, another type of element may be provided instead of a thin film transistor, as long as it is an element that functions as a switch.

Figure 9A:
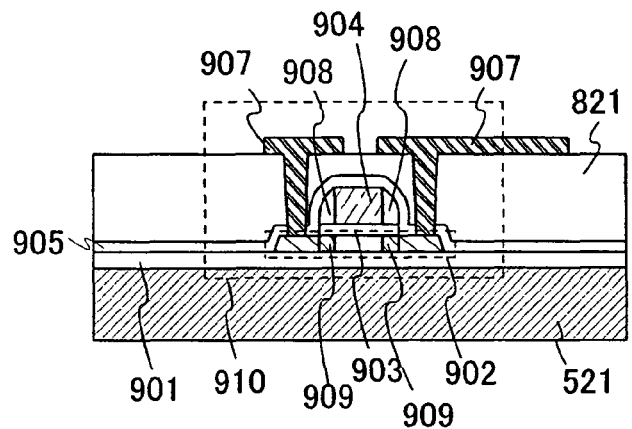
FIGS. 9A to 9D are diagrams each illustrating a mode of a thin film transistor.

One mode of the thin film transistor 721 will be described using FIGS. 9A to 9D. In FIG. 9A, an example is shown in which a top-gate thin film transistor is applied. An insulating layer 901 that functions as a base film is formed over the substrate 521, and a thin film transistor 910 is formed over the insulating film 901. The thin film transistor 910 is formed of a semiconductor layer 902 and an insulating layer 903 that can function as a gate insulating layer that are formed over the insulating layer 901 and, further, a gate electrode 904 formed over the semiconductor layer 902 with the insulating layer 903 interposed between the semiconductor layer 902 and the gate electrode 904. It is to be noted that an insulating layer 905 that functions as a protective layer and an insulating layer 821 that functions as an interlayer insulating layer are formed over the thin film transistor 910. In addition, wirings 907 each connected to a source region and a drain region of the semiconductor layer are formed.

The insulating layer 901 is formed using one or more of an insulating film selected from a silicon oxide film, a silicon nitride film, a silicon oxynitride film, and the like as a single layer or as a plurality of two or more layers. It is to be noted that the insulating layer 901 may be formed using a sputtering method, a CVD method, or the like.

For the semiconductor layer 902, in addition to a non-crystalline semiconductor film of an amorphous semiconductor such as amorphous silicon or the like, a semi-amorphous semiconductor, a microcrystalline semiconductor, or the like, a crystalline semiconductor film of polysilicon or the like may also be used.

In particular, it is preferable that a crystalline semiconductor crystallized by irradiation with a laser beam of an amorphous or microcrystalline semiconductor, a crystalline semiconductor crystallized by heat treatment, or a crystalline semiconductor crystallized by a combination of heat treatment and irradiation with a laser beam be applied. For heat treatment, a crystallization method can be applied that uses a metallic element such as nickel or the like that functions to promote crystallization of a silicon semiconductor.

When crystallization is performed by irradiation with a laser beam, crystallization can be performed by irradiation with a continuous-wave laser beam or with an ultra-short pulsed laser beam with a high repetition rate of 10 MHz or more and a pulse width of 1 nanosecond or less, preferably, from 1 to 100 picoseconds, where a melting zone of a melted crystallized semiconductor is continuously moved in the direction of irradiation with the laser beam. By this kind of crystallization method, a crystallized semiconductor with a large grain size and in which crystal grain boundaries extend in a single direction can be obtained. By alignment of the direction of carrier drift with the direction along which these crystal grains extend, the electric field effect mobility of a transistor can be increased. For example, an electric field effect mobility of 400 cm$^2$/(V·s) can be achieved.

When the above crystallization step is performed using a crystallization process in which a glass substrate is heated to a temperature less than or equal to the allowable temperature limit of the glass substrate (approximately 600° C.), a glass substrate with a large area can be used. For this reason, a large number of semiconductor devices can be manufactured per substrate, and costs can be lowered.

In addition, the semiconductor layer 902 may be formed by performance of a crystallization step in which heat treatment is performed at a temperature greater than or equal to the allowable temperature limit of the glass substrate using a substrate that can withstand the heating temperature. Typically, the semiconductor layer 902 is formed by heating of an amorphous or microcrystalline semiconductor at a temperature greater than or equal to 700° C. using a quartz substrate over an insulating substrate. As a result, a semiconductor with a high crystallinity can be formed. In this case, because characteristics such as response speed, carrier mobility, and the like are favorable, a thin film transistor in which operations can be performed at high speed can be offered.

The gate electrode 904 can be formed of a polycrystalline semiconductor that is doped with a metal or with an impurity of one conductivity type. When a metal is used, tungsten (W), molybdenum (Mo), titanium (Ti), tantalum (Ta), aluminum (Al), or the like can be used. In addition, a metal nitride obtained from the nitriding of a metal can also be used. Alternatively, the gate electrode 904 may also be formed as a stacked structure of a first layer formed of a metal nitride and a second layer formed of a metal. When the stacked structure is used, the structure may be formed as a so-called hat shape in which the edge of the first layer protrudes beyond the edge of the second layer. At this time, because the first layer is formed of a metal nitride, the first layer can be set to be a barrier metal. That is, diffusion of the metal of the second layer into the insulating layer 903 and the semiconductor layer 902 under the insulating layer 903 can be prevented.

It is to be noted that, sidewalls (sidewall spacers) 908 may be formed on side surfaces of the gate electrode 904. The sidewalls can be formed by anisotropic etching by an RIE (reactive ion etching) method of an insulating layer formed by a CVD method.

For transistor formed by combination of the semiconductor layer 902, the insulating layer 903, and the gate electrode 904, various structures, such as a single drain structure, an LDD (lightly doped drain) structure, a gate-overlapped drain structure, and the like can be applied. It is to be noted that, in FIG. 9A, a thin film transistor with an LDD structure in which low-concentration impurity regions 909 are formed in a semiconductor layer superimposed by sidewalls is shown. Alternatively, a single-gate structure, a multi-gate structure in which a gate voltage of the same potential is applied equally to transistors connected in series, a dual-gate structure in which a semiconductor layer is sandwiched by gate electrodes above and below, or the like can also be applied.

The insulating layer 821 is formed of an inorganic insulating material such as silicon oxide, silicon oxynitride, or the like or of an organic insulating material such as an acrylic resin, a polyimide resin, or the like. When a coating method such as a spin coating or roll coater method is used, an insulating layer formed of silicon oxide by heat treatment after an insulating film material dissolved in an organic solvent is applied can be used, as well. For example, an insulating layer that can be formed by heat treatment at a temperature of from 200° C. to 400° C. after a coating film that contains siloxane bonds is formed can be used. By formation of the insulating layer 821 as an insulating layer formed by a coating method or as an insulating layer flattened by a reflow method, disconnection of wirings formed over this layer can be prevented. Furthermore, when multi-layer wirings are formed, the above coating method can be used effectively.

The wirings 907 formed over the insulating layer 821 can be provided to intersect with wirings formed in the same layer as the gate electrode 904 and these wirings are formed as a multi-layer wiring structure. A plurality of insulating layers that each have a function similar to that of the insulating layer 821 is stacked together, and, by formation of wirings over these layers, a multi-layer wiring structure can be formed. Forming the wirings 907 as a stacked-layer structure of a combination of a material with a low resistance, such as aluminum (Al) or the like, and a barrier metal using a metallic material with a high melting point, such as titanium (Ti), molybdenum (Mo), or the like, for example, a stacked-layer structure of titanium (Ti) and aluminum (Al), a stacked-layer structure of molybdenum (Mo) and aluminum (Al), or the like, is preferable.

Figure 9B:
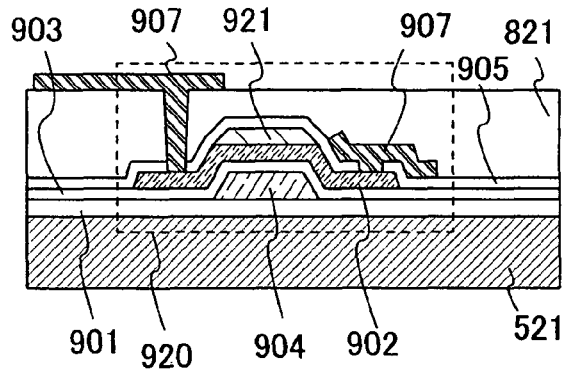

In FIG. 9B, an example is shown in which a bottom-gate thin film transistor is applied. The insulating layer 901 is formed over the insulating substrate 521, and a thin film transistor 920 is formed over the insulating layer 901. In the thin film transistor 920, the gate electrode 904, the insulating layer 903 that functions as a gate insulating layer, and the semiconductor layer 902 are provided, and, moreover, a channel protection layer 921, an insulating layer 905 that functions as a protective film, and an insulating layer 821 that functions as an interlayer insulating layer are provided thereover. Furthermore, over those layers, an insulating layer (not shown) that functions as a protective film may be provided. The wirings 907, each of which is connected to a source region or drain region of the semiconductor layer, can be formed over the insulating layer 905 or over the insulating layer 821. It is to be noted that, for a bottom-gate thin film transistor, the insulating layer 901 need not be formed.

In addition, when the substrate 521 is a substrate that has flexibility, the maximum allowable temperature to which the substrate can be heated is lower than that of a substrate, such as a glass substrate or the like, that does not have flexibility. For this reason, using an organic semiconductor to form the semiconductor layer of the thin film transistor is preferable.

Figure 9C:
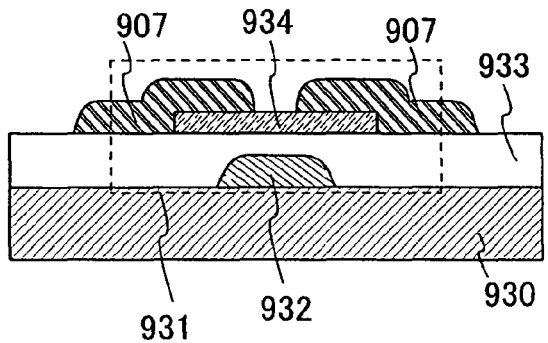

Here, the structure of a thin film transistor in which an organic semiconductor is used for the semiconductor layer will be described with reference to FIGS. 9C and 9D. In FIG. 9C, an example is shown in which a staggered organic semiconductor transistor is applied. An organic semiconductor transistor 931 is provided over a substrate 930 that has flexibility. The organic semiconductor transistor 931 has a gate electrode 932, an insulating layer 933 that functions as a gate insulating film, and a semiconductor layer 934 provided in a location of overlap with the gate electrode 932 and the gate insulating film 933; the wirings 907 are connected to the semiconductor layer 934. It is to be noted that the semiconductor layer 934 comes into contact with the insulating layer 933 that functions as a gate insulating film and with the wirings 907.

The gate electrode 932 can be formed using materials and a method similar to the materials and method used to form the gate electrode 904. Alternatively, the gate electrode 932 can be formed using a droplet discharge method and by drying and baking. Furthermore, the gate electrode 932 can be formed by printing of a paste that contains fine particles of a metal over a substrate that has flexibility by a printing method and by drying and baking. For typical examples of the fine particles, fine particles of a metal with any of the following as the main component may be used: gold, copper, an alloy of gold and silver, an alloy of gold and copper, an alloy of silver and copper, or an alloy of gold, silver, and copper. In addition, fine particles with a conductive oxide, such as indium tin oxide (ITO) or the like, as the main component may also be used.

The insulating layer 933 that functions as a gate insulating film can be formed using materials and a method similar to the materials and method used to form the insulating layer 903. However, when the insulating layer is formed by heat treatment after an insulating material dissolved in an organic solvent is applied, heat treatment is performed at a temperature lower than the maximum allowable temperature to which the substrate that has flexibility can be heated.

For a material of the semiconductor layer 934 of the organic semiconductor transistor, a polycyclic aromatic compound, a compound bearing conjugated double bonds, a phthalocyanine, a charge transfer complex, and the like can be given. For example, anthracene, tetracene, pentacene, hexathiophene (6T), tetracyanoquinodimethane (TCNQ), perylene carboxylic anhydride (PTCDA), naphthalene carboxylic anhydride (NTCDA), or the like can be used. In addition, for a material of the semiconductor layer 934 of the organic semiconductor transistor, a π-conjugated polymer, a σ-conjugated polymer, a carbon nanotube, poly(vinyl pyridine), a metal phthalocyanine complex, and the like can be given. In particular, it is preferable to use any of the following π-conjugated polymers, which each have a skeleton formed of conjugated multiple bonds: polyacetylene, polyaniline, polypyrrole, polythienylene, a polythiophene derivative, poly (3-alkylthiophene), a polyarylene derivative, a polyarylenevinylene derivative, or a polyaryleneethynylene derivative.

In addition, for a formation method of the semiconductor layer of the organic semiconductor transistor, a method by which a film of uniform thickness can be formed over a substrate may be used. For the thickness, a thickness greater than or equal to 1 nm and less than or equal to 1000 nm, preferably, greater than or equal to 10 nm and less than or equal to 100 nm, is desirable. For a specific method, an evaporation method, a coating method, a spin coating method, a bar coating method, a solution casting method, a dipping method, a screen printing method, a roll coater method, or a droplet discharge method can be used.

Figure 9D:
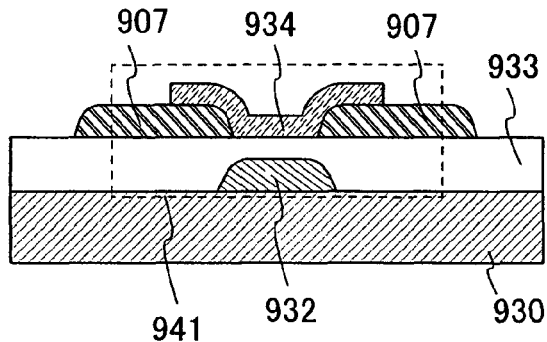

In FIG. 9D, an example is shown in which a coplanar organic semiconductor transistor is applied. An organic semiconductor transistor 941 is provided over a substrate 930 that has flexibility. The organic semiconductor transistor 941 has a gate electrode 932, an insulating layer 933 that functions as a gate insulating film, and a semiconductor layer 934 provided in a location of overlap with the gate electrode 932 and the insulating layer 933; wirings 907 are connected to the semiconductor layer 934. In addition, the wirings 907 connected to the semiconductor layer 934 come into contact with the insulating layer that functions as a gate insulating film and with the semiconductor layer.

As long as the thin film transistor or organic semiconductor transistor is a component that can function as a switching element, the thin film transistor or organic semiconductor transistor may be formed with any kind of structure. It is to be noted that the wirings 907 may be used as the first conductive layer in the memory element of the present invention, and the memory element of the present invention may be connected to the wirings 907.

Furthermore, a memory element may be formed over a transistor that is formed using a single-crystal substrate or an SOI substrate. The SOI substrate may be formed using a method by wafer bonding or using a method called SIMOX in which an insulating layer 831 is formed inside an Si substrate by implantation of oxygen ions into the Si substrate.

Figure 8C:
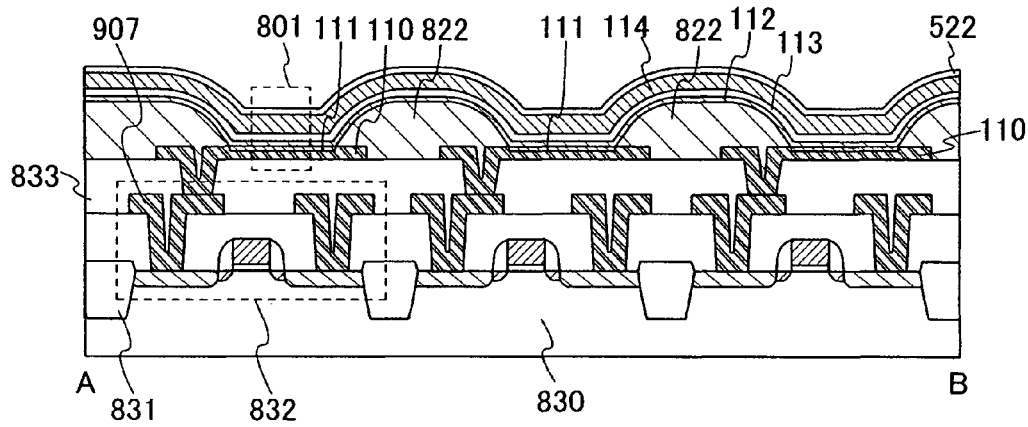

For example, when a single-crystal semiconductor is used for the substrate, as shown in FIG. 8C, the memory element 801 is connected to the field effect transistor 832 provided using a single-crystal semiconductor substrate 830. Furthermore, an insulating layer 833 is formed so as to cover wirings of the field effect transistor 832, and the memory element 801 is formed over the insulating layer 833.

Because characteristics, such as response speed, carrier mobility, and the like, of a transistor formed by this kind of single-crystal semiconductor substrate, are favorable, a thin film transistor in which operations can be performed at high speed can be offered.

It is to be noted that the memory element 801 has a first conductive layer 110, a metal oxide layer 111, a semiconductor layer 112, an organic compound layer 113, and a second conductive layer 114, which are all provided over the insulating layer 833, with a structure in which the metal oxide layer 111, semiconductor layer 112, and organic compound layer 113 are interposed between the first conductive layer 110 and the second conductive layer 114. Note that the metal oxide layer 111 is provided in contact with the first conductive layer 110 and the semiconductor layer 112 is provided in contact with the metal oxide layer 111.

In this way, by formation of the memory element 801 provided over the insulating layer 833, the first conductive layer 110 can be placed freely. That is, in the structure in FIG. 8B, the memory element needs to be formed in a region where the wirings connected to the transistor are not formed; however, by provision of the insulating layer 833, for example, as shown in FIG. 8C, the memory element 801 can be formed over the transistor 832. As a result, a memory circuit can be formed at an even higher level of integration. Of course, the wirings 907 included in the field effect transistor 832 may be used as the first conductive layer of the memory element.

It is to be noted that, in the structures shown in FIGS. 8B and 8C, an example is shown in which the semiconductor layer 112 and organic compound layer 113 are formed over the entire surface of the substrate; however, these organic compound layers may be formed over each memory cell only. In this case, by selective formation of an organic compound layer by discharge and baking of an organic compound using a droplet discharge method or the like, the usage efficiency of the materials can be improved.

Figure 10:
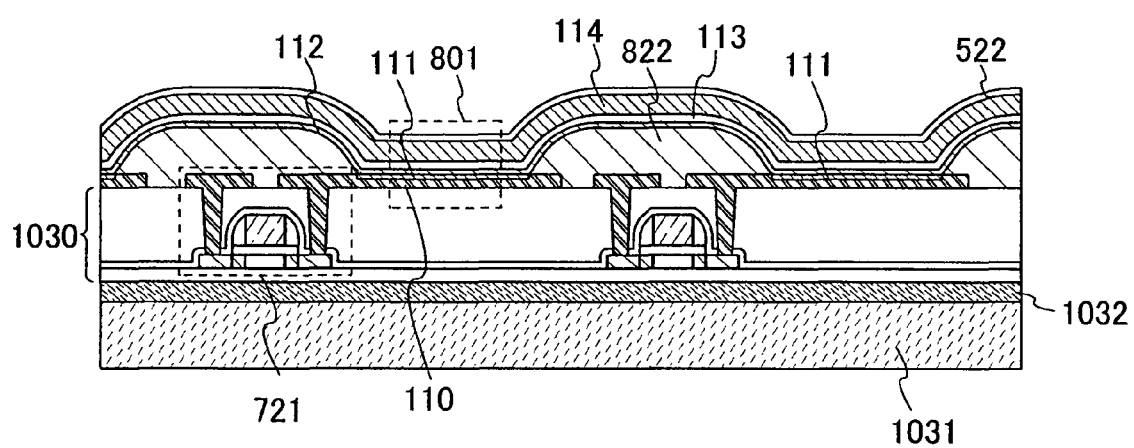
FIG. 10 is a diagram illustrating an example of a structure of a semiconductor device of the present invention.

In addition, after a peeling layer is formed over a substrate and a layer 1030 that includes a transistor and the memory element 801 are formed over the peeling layer, the layer 1030 that includes a transistor and the memory element 801 may be separated from the substrate using the peeling layer, and, as shown in FIG. 10, the layer 1030 that includes a transistor and the memory element 801 may be bonded to a substrate 1031 that differs from the previous substrate by use of an adhesive layer 1032. For the separation method, any of the following methods may be used: (1) a method in which a metal oxide layer acting as the peeling layer is interposed between a substrate with high heat tolerance and the layer that includes a transistor, the metal oxide layer is made brittle by crystallization, and the layer that includes a transistor is separated from the substrate; (2) a method in which an amorphous silicon film that contains hydrogen is interposed between a substrate with high heat tolerance and the layer that includes a transistor, the amorphous silicon film is removed by irradiation with a laser beam or by etching, and the layer that includes a transistor is separated from the substrate; (3) a method in which a substrate with high heat tolerance over which the layer that includes a transistor is formed is eliminated mechanically or removed by etching with an etching solution, with $NF_3$ gas, or with a halogen fluoride gas such as $BrF_3$, $ClF_3$, or the like; (4) a method in which a metal layer and a metal oxide layer acting as the peeling layer are interposed between a substrate with high heat tolerance and the layer that includes a transistor, and after the metal oxide layer is made brittle by crystallization or a part of the metal layer is removed by etching with an etching solution, with $NF_3$ gas, or with a halogen fluoride gas such as $BrF_3$, $ClF_3$, or the like, the substrate and the layer that includes a transistor are physically separated from each other at the metal oxide layer that has been made brittle.

Furthermore, for the substrate 1031, by use of the flexible substrate, film, paper formed of a fibrous material, or the like that are presented for the substrate 521 shown in Embodiment Mode 2, a reduction in the size, thickness, and weight of a memory device can be achieved.

Next, an operation for writing of data to a memory device, that is, the semiconductor device 700, will be described using FIG. 7A. As in Embodiment Mode 2, an operation, here, an electrical operation, performed when data is written to the memory device, typically, performed by application of a voltage, will be described. It is to be noted that writing is performed by changing of the electrical characteristics of a memory cell; the initial state (a state in which an electrical operation is not applied) is defined as data of [0], and the state in which electrical characteristics have been changed is defined as data of [1].

A case when data is written to a memory cell 701 of the $x^{th}$ row and $y^{th}$ column is described. When data of [1] is written to the memory cell 701, first, the memory cell 701 is selected by the decoders 712 and 713 and the selector 714. Specifically, a given potential V22 is applied to the word line Wy connected to the memory cell 701 by the decoder 713. In addition, the reading/writing circuit 715 is connected to the bit line Bx connected to the memory cell 701 by the decoder 712 and the selector 714. A writing voltage V21 is output to the bit line Bx from the reading/writing circuit 715.

In this way, a thin film transistor 721 included in the memory cell 701 is placed in an on state, a common electrode and a bit line are electrically connected to the memory element 722, and a voltage roughly equal to Vw=Vcom−V21 is applied to the memory element 722. Vcom is the potential of a common electrode, that is, the second conductive layer, in the memory element 722. By selection of a suitable voltage for the voltage Vw, properties of a layer containing an organic compound that is provided between the first conductive layer and the second conductive layer are changed physically or electrically, and writing of data of [1] is performed. Specifically, at the reading operation voltage, the electrical resistance between the first conductive layer and the second conductive layer for the state of data of [1], compared to that of the state of data of [0], may be dramatically decreased, and the first conductive layer and second conductive layer may even be short-circuited (shorted). It is to be noted that the potential may be selected, as appropriate, from the ranges of (V21, V22, Vcom)=(from 5 V to 15 V, from 5 V to 15 V, 0 V) or (V21, V22, Vcom)=(from −12 V to 0 V, from −12 V to 0 V, from 3 V to 5 V). The voltage Vw may be set to be greater than or equal to 5 V and less than or equal to 15 V or to be greater than or equal to −15 V and less than or equal to −5 V.

It is to be noted that non-selected word lines and non-selected bit lines are controlled so that data of [1] is not written to memory cells connected to those lines. Specifically, a potential that places a transistor of a memory cell connected to a non-selected word line into an off state may be applied, or a potential approximately equal to Vcom may be applied.

On the other hand, when data of [0] is written to the memory cell 701, an electrical operation need not be applied to the memory cell 701. For the circuit operation, for example, as for when data of [1] is written, the memory cell 701 is selected by the decoders 712 and 713 and the selector 714; however, an output potential output from the reading/writing circuit 715 to the bit line Bx may be set to be equivalent to Vcom or may be a potential that places the thin film transistor 721 of the memory cell into an off state. As a result, because either a low voltage (for example, a voltage from −5 V to 5 V) is applied or else no voltage is applied to the memory element 722, the electrical characteristics are not changed, and writing of data of [0] is realized.

Subsequently, an operation performed for reading of data from the memory element by an electrical operation will be described using FIG. 7B. Reading of data is performed using the difference in electrical characteristics of the memory element 722 between a memory element with data of [0] and a memory element with data of [1]. For example, a reading method will be described that uses the difference in electrical resistance between that of the memory element included in the memory cell with data of [0] is defined as R0 at the reading voltage and the electrical resistance of the memory element included in the memory cell with data of [1] is defined as R1 at the reading voltage. It is to be noted that R1 is set to be much less than R0, or R1<<R0. As the reading/writing circuit 715, for the structure of the reading portion, for example, the circuit shown in FIG. 7B that has a resistor 750 and a differential amplifier 751 can be used. The resistor 750 has a resistance Rr, where R1<Rr<R0. In addition, in exchange for the resistor 750, as shown in FIG. 7C, a transistor 752 may be used, and a clocked inverter 753 can be used in exchange for the differential amplifier 751. Of course, the circuit structure is not limited to those shown in FIGS. 7B and 7C.

When reading of data from a memory cell 702 of the $x^{th}$ row and $y^{th}$ column is performed, first, the memory cell 702 is selected by the decoders 712 and 713 and the selector 714. Specifically, a given potential V24 is applied to a word line Wy connected to the memory cell 702 by the decoder 713, and the thin film transistor 721 is placed in an on state. In addition, a bit line Bx connected to the memory cell 702 is connected to a terminal P of the reading/writing circuit 715 by the decoder 712 and the selector 714. As a result, a potential Vp of the terminal P comes to be a value determined by resistor divider where the resistance of the resistor 450 (resistance of Rr) and the memory element 402 (resistance of R0 or R1) are determined by Vy and V0. Accordingly, a potential Vp0 of the terminal P when the memory cell 702 has data of [0] becomes Vp0=Vcom+(V0−Vcom)×R0/(R0+Rr). Furthermore, the potential Vp1 of the terminal P when the memory cell 702 has data of [1] becomes Vp1=Vcom+(V0−Vcom)×R1/(R1+Rr). As a result, in FIG. 7B, by selection of a Vref whose value falls between Vp0 and Vp1, or by selection of a point of change of the clocked inverter in FIG. 7C that comes to be between Vp0 and Vp1, Low/High (or High/Low) is output as an output potential Vout in response to data of [0]/[1], and reading can be performed.

For example, the differential amplifier 751 operates at Vdd=3 V, and the following are set: Vcom=0 V, V0=3 V, and Vref=1.5 V. Assuming that R0/Rr=Rr/R1=9, if the on resistance of the thin film transistor 721 can be ignored, when the data of the memory cell is [0], Vp0 becomes 2.7 V, Vp0=2.7 V, and a High is output for Vout; when the data of the memory cell is [1], Vp1 becomes 0.3 V, Vp1=0.3 V, and a Low is output for Vout. In this way, reading of the memory cell can be performed.

By the above method, the amount of voltage is read using differences in the resistance of the memory element 722 and resistance division. Of course, the reading method is not limited to this method. For example, other than use of the difference in resistance, reading may be performed using the difference in current. Alternatively, when the electrical characteristics of the memory cell include diode characteristics in which the threshold voltage varies for data of "0" and for data of "1," reading may be performed using the difference in threshold voltages.

In addition, a memory element or memory element array may be formed over a thin film transistor (TFT) that is formed over an insulating substrate, or the memory element or memory element array may be formed over a field effect transistor (FET) formed on a semiconductor substrate of Si or the like or an SOI substrate used instead of the substrate that has an insulator.

The semiconductor device presented in the present embodiment mode is one in which, by memory elements of the present invention being included in the semiconductor device, variations in programming behavior from memory element to memory element can be reduced. For this reason, a semiconductor device with excellent writing characteristics can be fabricated. In addition, an increase in writing voltage can be prevented, and the margin for the reading voltage can be widened. Consequently, the amount of freedom in design of the semiconductor device can be increased.

Furthermore, not only is data written to the semiconductor device just once, but additional data (appended data) can be written to the semiconductor device while memory elements to which data has not been written still remain. On the other hand, because data cannot be erased once writing to the memory element has been performed, forgery due to rewriting of data can be prevented. Moreover, because the memory element of the present invention is one that has a simple structure in which a metal oxide layer, a semiconductor layer, and an organic compound layer are interposed between a pair of conductive layers, a semiconductor device with excellent writing characteristics can be manufactured at low cost.

It is to be noted that the present embodiment mode can be freely combined with any of the other embodiment modes and embodiments.

Embodiment Mode 4

In the present embodiment mode, an example of a structure of a semiconductor device that includes the memory device presented in the above embodiment modes will be described using drawings.

A semiconductor device shown in the present embodiment mode is one in which data can be read and written wirelessly. The data transmission format is roughly divided into the following three methods: an electromagnetic coupling method in which a pair of coils are placed facing each other and communication is performed by mutual induction, an electromagnetic induction method in which communication is performed by induction field, and an electromagnetic wave method in which communication is performed using electromagnetic waves, and any of the three methods may be used. In addition, there are two ways for providing an antenna used for transmission and reception of data: one way is to provide an antenna over a substrate over which a transistor and memory element are formed, and the other way is to provide a terminal portion over a substrate over which a transistor and memory element are provided and connecting an antenna provided over a separate substrate to the terminal portion.

Figure 11A:
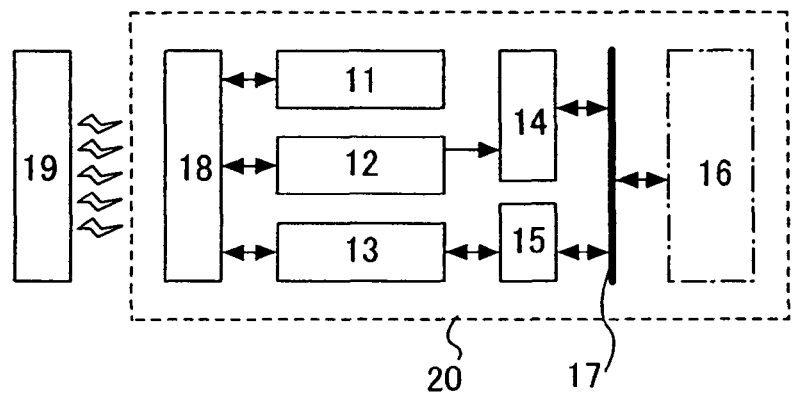
FIGS. 11A to 11C are diagrams each illustrating an example of a structure of a semiconductor device of the present invention.

A structure of the semiconductor device presented in the present embodiment mode will be described with reference to FIGS. 11A to 11C. As shown in FIG. 11A, a semiconductor device 20 of the present invention has a function by which data can be communicated wirelessly and includes a power supply circuit 11, a clock generator circuit 12, a data demodulator/modulator circuit 13, a control circuit 14 for controlling other circuits, an interface circuit 15, a memory circuit 16, a bus 17, and an antenna 18.

Figure 11B:
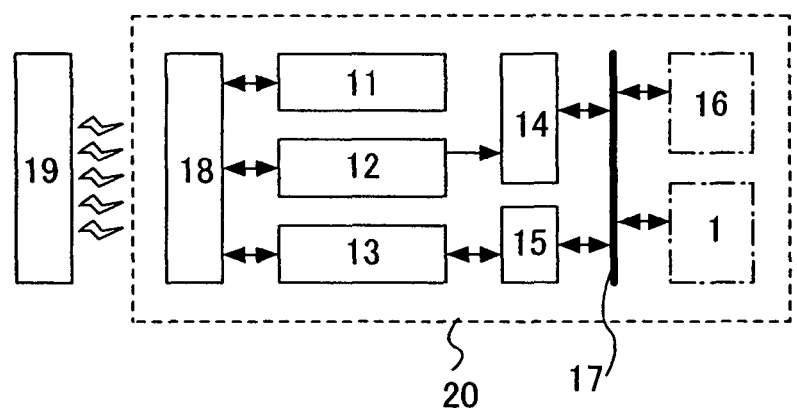

Furthermore, as shown in FIG. 11B, the semiconductor device 20 of the present invention has a function by which data can be communicated by non-contact and may include a central processing unit 1, in addition to the power supply circuit 11, the clock generator circuit 12, the data demodulator/modulator circuit 13, the control circuit 14 for controlling other circuits, the interface circuit 15, the memory circuit 16, the bus 17, and the antenna 18.

Figure 11C:
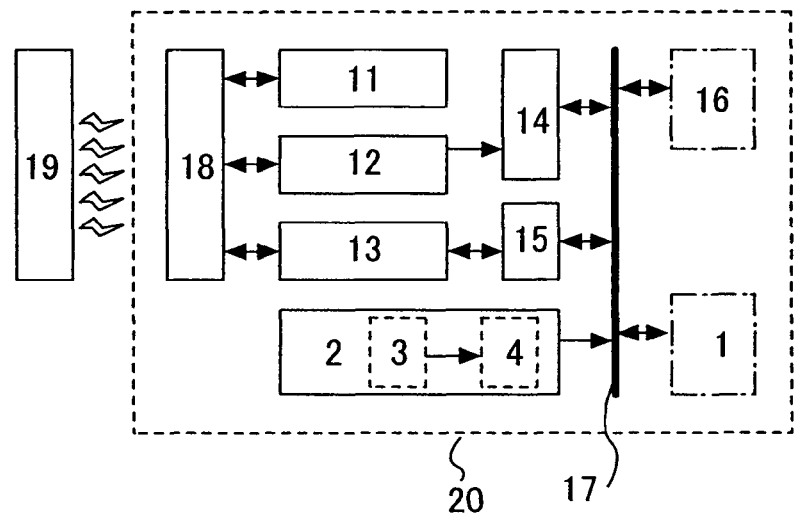

Moreover, as shown in FIG. 11C, the semiconductor device 20 of the present invention has a function by which data can be communicated by non-contact and may include a detector 2 that has a detector element 3 and a detector circuit 4, in addition to the power supply circuit 11, the clock generator circuit 12, the data demodulator/modulator circuit 13, the control circuit 14 for controlling other circuits, the interface circuit 15, the memory circuit 16, the bus 17, the antenna 18, and the central processing unit 1.

The power supply circuit 11 is a circuit that generates a variety of power supply signals that are supplied to every internal circuit of the semiconductor device 20 based on alternating current signals input from the antenna 18. The clock generating circuit 12 is a circuit that generates a variety of clock signals that are supplied to respective internal circuits of the semiconductor device 20 for each of the signals based on alternating current signals input from the antenna 18. The data demodulating/modulating circuit 13 has a function of demodulating/modulating data exchanged with a reader/writer 19. The control circuit 14 has a function of controlling the memory circuit 16. The antenna 18 has a function of transmitting and receiving electromagnetic waves. The reader/writer 19 communicates with and controls the semiconductor device and controls the processing of data thereof. It is to be noted that the semiconductor device is not restricted to the above configuration; for example, the configuration may be one in which additional components, such as a power supply voltage limiter circuit or hardware used exclusively for cryptography, are included.

The memory circuit 16 includes one or a plurality of memory elements selected from a memory element presented in Embodiment Mode 1. By a memory element of the present invention being included, variations in programming behavior from memory element to memory element can be reduced. For this reason, a semiconductor device with excellent writing characteristics can be fabricated. In addition, an increase in writing voltage can be prevented, and the margin for reading voltage can be widened. Consequently, the amount of freedom in design of the semiconductor device can be increased.

Furthermore, not only is data written to the semiconductor device just once, but additional data (appended data) can also be written to the semiconductor device while memory elements to which data has not been written still remain. On the other hand, because data cannot be erased once writing to the memory element has been performed, forgery due to rewriting of data can be prevented.

Moreover, the detector 2 can be used to detect temperature, pressure, flow rate, light, magnetism, sound waves, acceleration, humidity, gas components, and liquid components, as well as other characteristics, by physical or chemical methods. It is to be noted that detector 2 includes the detector element 3 that detects physical quantities or chemical quantities and the detector circuit 4 that converts the physical quantity or chemical quantity detected by the detector element 3 into an appropriate signal, such as into an electrical signal or the like. The detector element 3 can be formed of a resistor, a capacitive coupling element, an inductive coupling element, a photovoltaic element, a photoelectric conversion element, a thermoelectric power element, a transistor, a thermistor, a diode, or the like. Note that the detector 2 may be provided as a plurality of detectors, and, in that case, a plurality of physical quantities or chemical quantities can be detected simultaneously.

Here, the term "physical quantity" indicates quantities such as temperature, pressure, flow rate, light, magnetism, sound waves, acceleration, humidity, and the like; the term "chemical quantity" given here indicates quantities such as gas components of a gas or the like, liquid components such as an ion or the like, and so forth. In addition to the above chemical quantities, organic compounds of specific biological materials and the like contained in blood, sweat, urine, and the like (for example, the level of blood sugar or the like contained in blood) are also included. In particular, when detection of a chemical quantity is attempted, because there is a need to selectively detect a specific material, a material that reacts selectively with the material that is to be detected is provided in the detector element 3 in advance. For example, when detection of a biological material is performed, it is preferable that an enzyme, an antibody, a microbial cell, or the like that selectively reacts with the biological material that is to be detected be immobilized in a macromolecule and provided in the detector element 3.

Figure 12A:
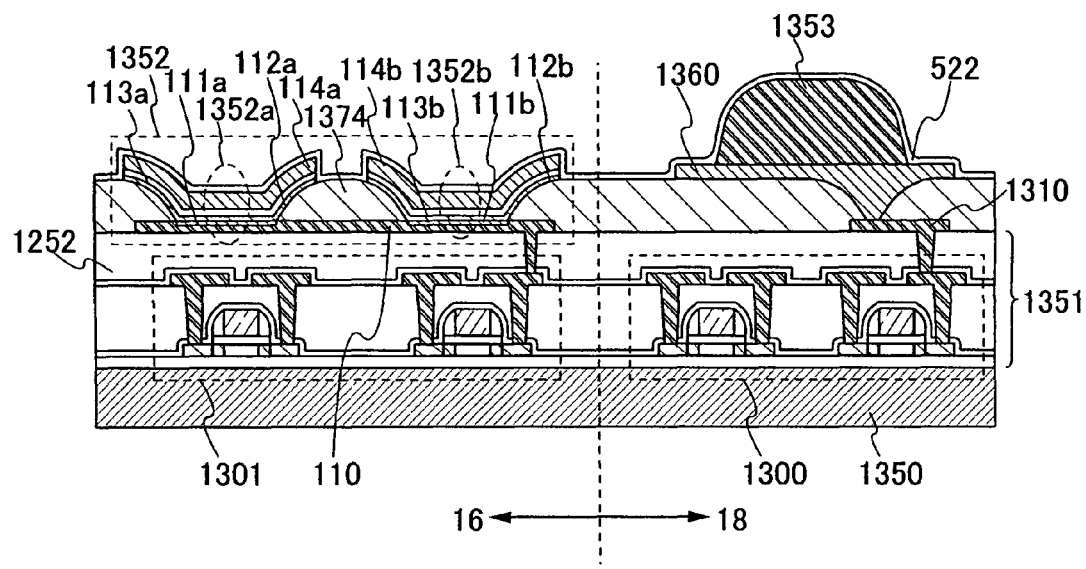
FIGS. 12A and 12B are diagrams each illustrating a part of a cross section of a semiconductor device of the present invention.
Figure 12B:
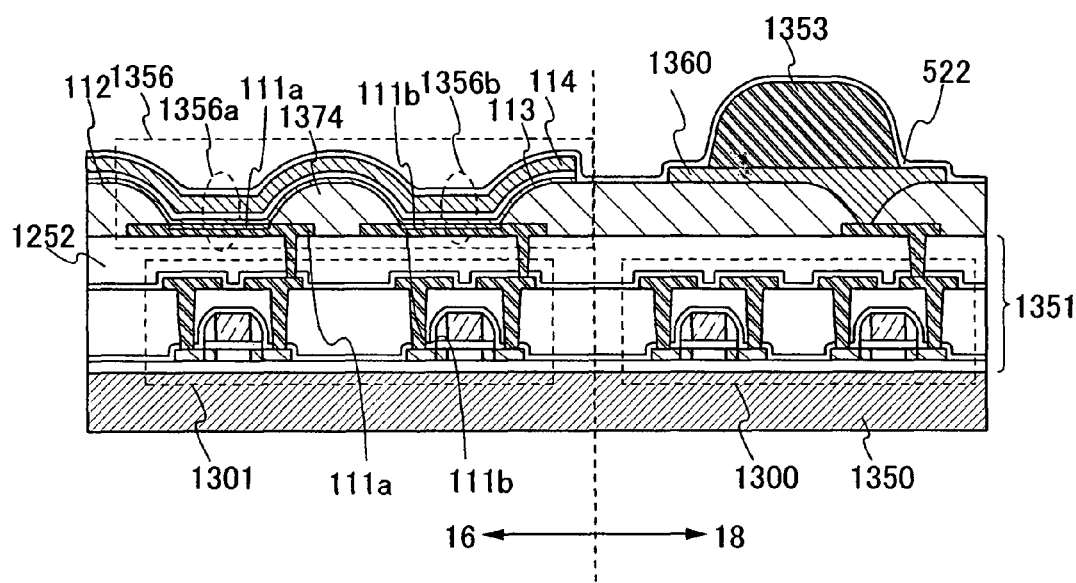

Next, an example of a structure of a semiconductor device in which an antenna is provided over a substrate over which a plurality of elements and memory elements are formed is shown in FIGS. 12A and 12B. It is to be noted that FIGS. 12A and 12B are partial cross-sectional view diagrams of the memory circuit 16 and the antenna 18.

In FIG. 12A, a semiconductor device that has a passive matrix memory circuit is shown. The semiconductor device has a layer 1351 that includes transistors 1300 and 1301 over a substrate 1350 and a memory element portion 1352 and a conductive layer 1353 that functions as an antenna over the layer 1351 that includes the transistors.

It is to be noted that, here, a case is shown in which the memory element portion 1352 and conductive layer 1353 that functions as an antenna are formed over the layer 1351 that includes the transistors; however, the structure of the present invention is not limited to this structure, and the memory element portion 1352 or the conductive layer 1353 that functions as an antenna may be included under the layer 1351 that includes the transistors or in the same layer as the layer 1351 that includes the transistors.

The memory element portion 1352 has a plurality of memory elements 1352a and 1352b. The memory element 1352a has a first conductive layer 110 formed over an insulating layer 1252, a metal oxide layer 111a formed using the first conductive layer 110, a semiconductor layer 112a formed to cover a portion of the first conductive layer 110 with the metal oxide layer 111a interposed between the semiconductor layer 112a and the first conductive layer 110, and an organic compound layer 113a and a second conductive layer 114a to further cover the semiconductor layer 112a. In addition, the memory element 1352b has a first conductive layer 110, a metal oxide layer 111b formed using the first conductive layer 110, a semiconductor layer 112b formed to cover a portion of the first conductive layer 110 with the metal oxide layer 111b interposed between the semiconductor layer 112b and the first conductive layer 110, and an organic compound layer 113b and a second conductive layer 114b to further cover the semiconductor layer 112b. The metal oxide layers 111a and 111b may also be formed by oxidation of a metal film formed separately from the first conductive layer 110. It is to be noted that individual memory elements 1352a and 1352b are separated from each other by partition walls (an insulating layer) 1374.

The first conductive layer 110 in the memory element portion 1352 is connected to a wiring of the transistor 1301, and the memory element portion 1352 can be formed using materials and a method similar to the materials and method used to form the memory elements of the above embodiment modes. Furthermore, an insulating layer 522 that functions as a protective film is formed to cover the second conductive layers 114a and 114b and the conductive layer 1353 that functions as an antenna.

It is to be noted that the conductive layer 1353 that functions as an antenna is formed over a conductive layer 1360. The conductive layer 1360 is connected to the transistor 1300 by a wiring 1310 formed in the same step in which the first conductive layer 110 of the memory element portion 1352 is formed. In addition, the conductive layer that functions as an antenna may be formed of the same layer as the second conductive layers 114a and 114b.

The conductive layer 1353 that functions as an antenna is formed of a conductive material using a CVD method; a sputtering method; a printing method such as a screen printing method, a gravure printing method, or the like; a droplet discharge method; a dispenser method; a plating method; or the like. The conductive material is formed of an element selected from aluminum (Al), titanium (Ti), silver (Ag), copper (Cu), gold (Au), platinum (Pt), nickel (Ni), palladium (Pd), tantalum (Ta), or molybdenum (Mo) or an alloy material or compound material with one or more of these elements as the main component, as a single-layer structure or a stacked-layer structure.

For example, when the conductive layer that functions as an antenna is formed using a screen printing method, the conductive layer that functions as an antenna can be formed by printing of a conductive paste, in which conductive particles each with a grain size of from several nanometers to several tens of micrometers are dissolved in or dispersed throughout an organic resin, onto the desired region selectively. For the conductive particles, fine particles or dispersible nanoparticles of a metal such as any one or more of silver (Ag), gold (Au), copper (Cu), nickel (Ni), platinum (Pt), palladium (Pd), tantalum (Ta), molybdenum (Mo), titanium (Ti), or the like; or of a silver halide can be used. For the organic resin contained in the conductive paste, organic resins, each functioning as a binder, a solvent, a dispersant, or a coating material of a metal particle, can be used. Typically, an organic resin such as an epoxy resin, a silicone resin, and the like can be given. Moreover, at the formation of the conductive layer, it is preferable that the conductive paste be baked after having been extruded out. For example, when fine particles (with a particle diameter, for example, greater than or equal to 1 nm and less than or equal to 100 nm) containing silver as the main component are used for the material of the conductive paste, by baking at a temperature in the range of from 150° C. to 300° C., a cured conductive layer can be obtained. Alternatively, fine particles containing solder or lead-free solder as the main component may also be used; in this case, using fine particles with a particle diameter less than or equal to 20 μm is preferable. Solder and lead-free solder have an advantage in being low cost. Furthermore, in addition to the above materials, a ceramic, ferrite, or the like may also be applied for the antenna.

For the transistors 1300 and 1301 included in the layer 1351 that includes the transistors, transistors presented in Embodiment Mode 3 or the like selected appropriately can be used.

Moreover, a peeling layer is formed over the substrate; the layer 1351 that contains the transistors, the memory element portion 1352, and the conductive layer 1353 that functions as an antenna are formed over the peeling layer; the layer 1351 that contains the transistors, the memory element portion 1352, and the conductive layer 1353 that functions as an antenna are separated from the substrate using an appropriate separation method of the separation methods given in Embodiment Mode 3 and may be attached to a substrate by an adhesive. For the substrate, by use of the flexible substrate, film, paper formed of a fibrous material, a base film, or the like that are given for the substrate 521 shown in Embodiment Mode 2, a reduction in size, thickness, and weight of a memory device can be achieved.

An example of a semiconductor device that has an active matrix memory circuit is shown in FIG. 12B. It is to be noted that a part of FIG. 12B differing from the part shown in FIG. 12A is illustrated in FIG. 12B.

The semiconductor device shown in FIG. 12B has a layer 1351 that includes transistors 1300 and 1301 over a substrate 1350 and a memory element portion 1356 and a conductive layer 1353 that functions as an antenna formed over the layer 1351 that includes the transistors. It is to be noted that, here, a case is shown in which the memory element portion 1356 and conductive layer 1353 that functions as an antenna are formed over the layer 1351 that includes the transistors; however, the structure of the present invention is not limited to this structure, and the memory element portion 1356 and the conductive layer 1353 that functions as an antenna may be included over or under the layer 1351 that includes the transistors. The memory element portion 1356 and the conductive layer 1353 that functions as an antenna may be included under the layer 1351 that includes the transistors or in the same layer as the layer 1351 that includes the transistors.

The memory element portion 1356 has memory elements 1356a and 1356b. The memory element 1356a has a first conductive layer 110a formed over an insulating layer 1252, a metal oxide layer 111a formed using the first conductive layer 110a, a semiconductor layer 112 formed to cover a portion of the first conductive layer 110a with the metal oxide layer 111a interposed between the semiconductor layer 112 and the first conductive layer 110a, and an organic compound layer 113 and a second conductive layer 114 to further cover the semiconductor layer 112. In addition, the memory element 1356b has a first conductive layer 110b formed over the insulating layer 1252, a metal oxide layer 111b formed using the first conductive layer 110b, a semiconductor layer 112 formed to cover a portion of the first conductive layer 110b with the metal oxide layer 111b interposed between the semiconductor layer 112 and the first conductive layer 110b, and the organic compound layer 113 and the second conductive layer 114 to further cover the semiconductor layer 112. The metal oxide layers 111a and 111b may also each be formed by oxidation of metal films formed separately from the first conductive layers 110a and 110b. It is to be noted that individual memory elements 1356a and 1356b are separated from each other by partition walls (an insulating layer) 1374. In addition, each of the first conductive layers formed in the memory elements is connected to a wiring of a transistor. That is, each memory element is connected to one transistor.

Moreover, a peeling layer may be formed over the substrate; the layer 1351 that contains the transistors, the memory element portion 1356, and the conductive layer 1353 that functions as an antenna may be formed over the peeling layer; and the layer 1351 that contains the transistors, the memory element portion 1356, and the conductive layer 1353 that functions as an antenna may be separated from the substrate using an appropriate separation method of the separation methods given in Embodiment Mode 3 and may be attached to a substrate by an adhesive.

Next, an example a semiconductor device having a first substrate and a second substrate will be described using FIGS. 13A and 13B, where a layer including transistors, a terminal portion connected to an antenna, and a memory element is formed on the first substrate, and the antenna connected to the terminal portion is formed on the second substrate. It is to be noted that a description is made of a part illustrated in FIGS. 13A and 13B that differs from the part shown in FIGS. 12A and 12B.

Figure 13A:
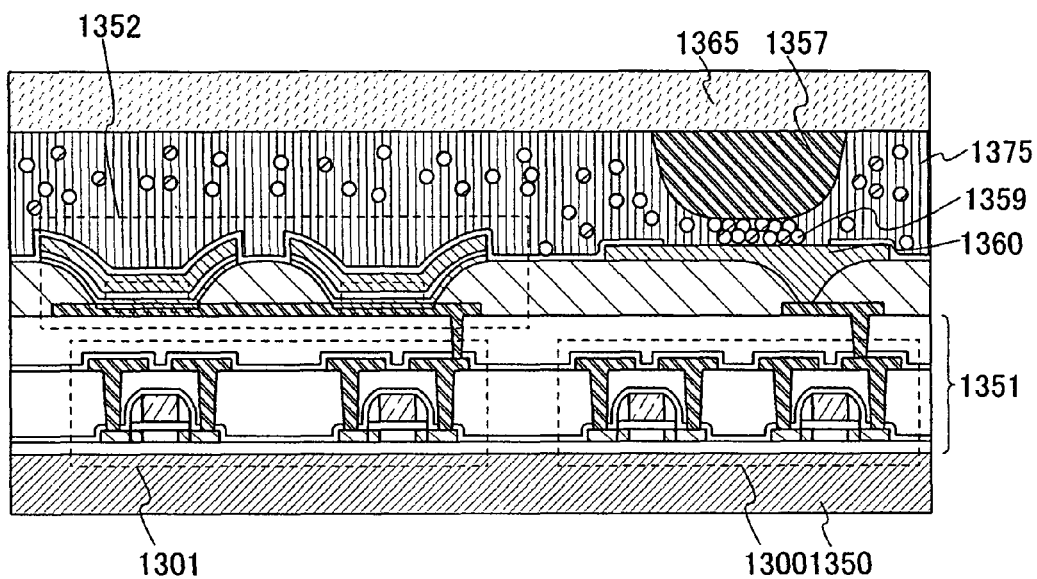
FIGS. 13A and 13B are diagrams each illustrating a part of a cross section of a semiconductor device of the present invention.

In FIG. 13A, a semiconductor device that has a passive matrix memory device is shown. The semiconductor device has a layer 1351 that includes transistors 1300 and 1301 formed over a substrate 1350, a memory element portion 1352 formed over the layer 1351 that includes the transistors, a terminal portion connected to an antenna, and a substrate 1365 over which a conductive layer 1357 that functions as an antenna is formed. The conductive layer 1357 and a conductive layer 1360 that acts as a connection terminal are electrically connected to each other by conductive particles 1359 contained throughout a resin 1375. The substrate 1350 that has the layer 1351 including the transistors and memory element portion 1352 and the substrate 1365 over which the conductive layer 1357 that functions as an antenna is formed are bonded together by an adhesive resin 1375.

Moreover, the conductive layer 1357 that functions as an antenna and the conductive layer 1360 that acts as a connection terminal may be connected to each other using a conductive adhesive of a silver paste, a copper paste, a carbon paste or the like or using a solder joint method. Here, a case is shown in which the memory element portion 1352 is formed over the layer 1351 that includes the transistors; however, the structure of the present invention is not limited to this structure, and the memory element portion 1352 may be included under the layer 1351 that includes the transistors or in the same layer as the layer 1351 that includes the transistors.

Figure 13B:
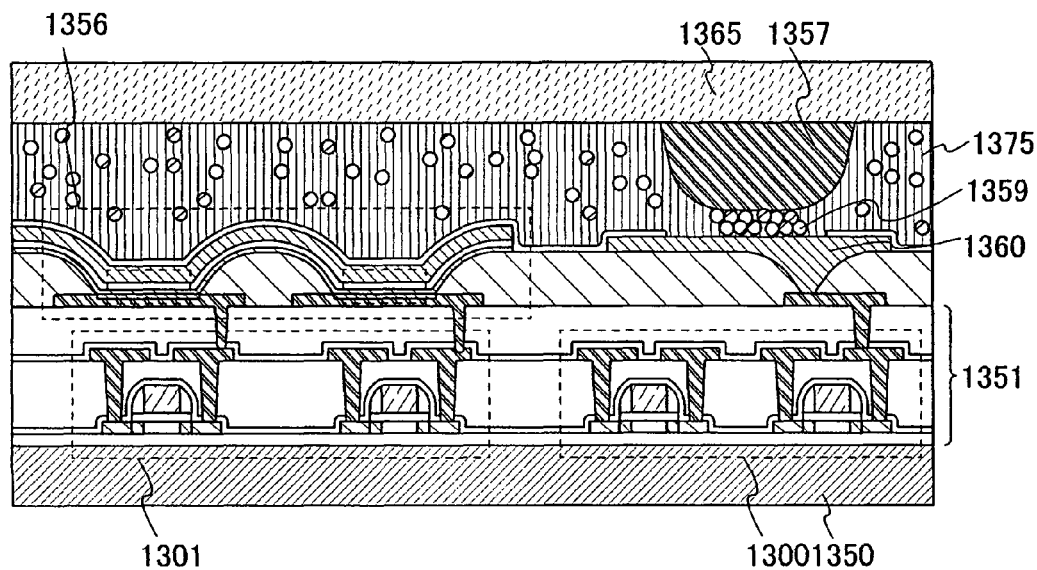

A semiconductor device in which an active matrix memory device is provided is shown in FIG. 13B. The semiconductor device has a layer 1351 that includes transistors 1300 and 1301 formed over a substrate 1350, a memory element portion 1356 formed over the layer 1351 that includes the transistors, a terminal portion connected to the transistor, and a substrate 1365 over which a conductive layer 1357 that functions as an antenna is formed, where the conductive layer 1357 and a conductive layer 1360 that acts as a connection terminal are electrically connected to each other by conductive particles 1359 contained throughout a resin 1375. It is to be noted that the substrate 1350 that has the layer 1351 that includes the transistors and memory element portion 1356 and the substrate 1365 over which the conductive layer 1357 that functions as an antenna is formed are bonded together by a resin 1375 that has adhesiveness.

Moreover, the substrate 1350 that has the layer 1351 that includes the transistors, the memory element portion 1356, and the like and the substrate 1365 over which the conductive layer 1357 that functions as an antenna is formed are bonded to each other by using a conductive adhesive of a silver paste, a copper paste, a carbon paste or the like or using a solder joint method. Here, a case is shown in which the memory element portion 1356 is formed over the layer 1351 that includes the transistors; however, the structure of the present invention is not limited to this structure, and the memory element portion 1356 may be included under the layer 1351 that includes the transistors or in the same layer as the layer 1351 that includes the transistors.

In addition, a peeling layer may be formed over the substrate; the layer 1351 that contains the transistors and the memory element portion 1352 or memory element portion 1356 may be formed over the peeling layer; and the layer 1351 that contains the transistors and the memory element portion 1352 or memory element portion 1356 are separated from the substrate using an appropriate separation method of the separation methods given in Embodiment Mode 3 and may be attached to a substrate by an adhesive.

In addition, the memory element portion 1352 or 1356 may be formed over the substrate 1365 over which the conductive layer 1357 that functions as an antenna is formed. That is, a first substrate over which a layer that includes transistors is formed and a second substrate over which a memory element portion and conductive layer that functions as an antenna are formed may be bonded together by a resin that contains conductive particles. Furthermore, as in the semiconductor devices shown in FIGS. 12A and 12B, a sensor connected to a transistor may also be provided.

For the semiconductor device presented in the present embodiment mode, by memory elements of the present invention being included in the semiconductor device, variations in programming behavior from memory element to memory element can be reduced. For this reason, a semiconductor device with excellent writing characteristics can be fabricated. In addition, an increase in writing voltage can be prevented, and the margin for reading voltage can be widened. Consequently, the amount of freedom in design of the semiconductor device can be increased.

Furthermore, not only is data written to the semiconductor device just once, but additional data (appended data) can also be written to the semiconductor device while memory elements to which data has not been written still remain. On the other hand, because data cannot be erased once writing to the memory element has been performed, forgery due to rewriting of data can be prevented. In addition, reading and writing of data can be performed by non-contact. Moreover, because the memory element of the present invention is one that has a simple structure in which a metal oxide layer, a semiconductor layer, and an organic compound layer are interposed between a pair of conductive layers, a semiconductor device with excellent writing characteristics can be manufactured at low cost.

It is to be noted that the present embodiment mode can be freely combined with any of the other embodiment modes and embodiments.

Embodiment Mode 5

In the present embodiment mode, an example of a semiconductor device that has the memory element of the present invention will be described using drawings. A top view of the semiconductor device of the present embodiment mode is shown in FIG. 14A, and a cross-sectional view along line X-Y in FIG. 14A is shown in FIG. 14B.

Figure 14A:
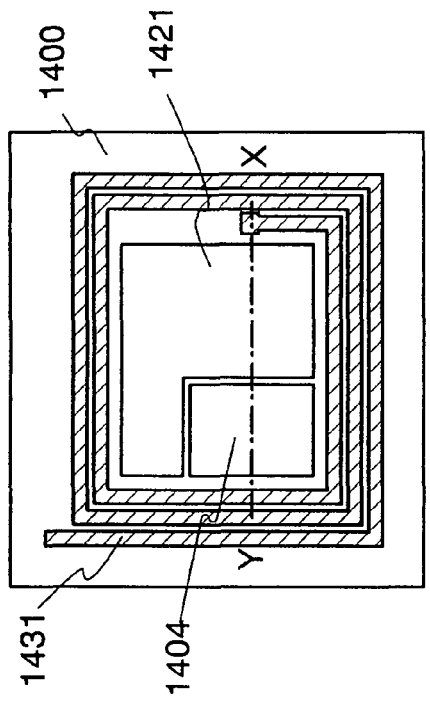
FIGS. 14A and 14B are diagrams illustrating a semiconductor device of the present invention.
Figure 14B:
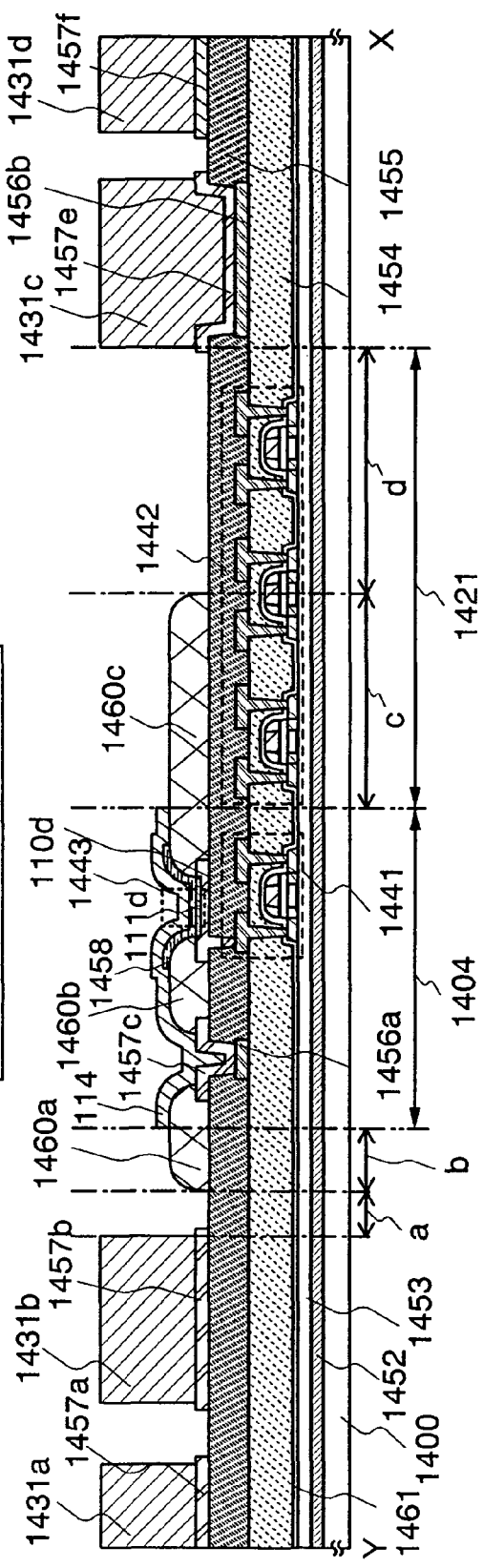
Figure 15A:
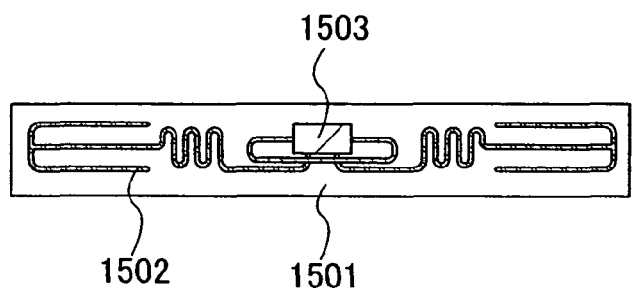
FIGS. 15A to 15D are diagrams illustrating a chip form of a semiconductor device of the present invention.
Figure 15B:
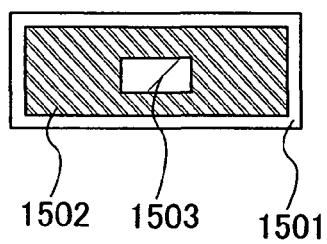
Figure 15C:
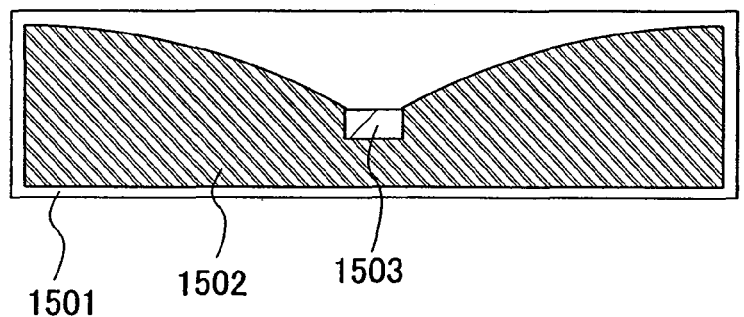
Figure 15D:
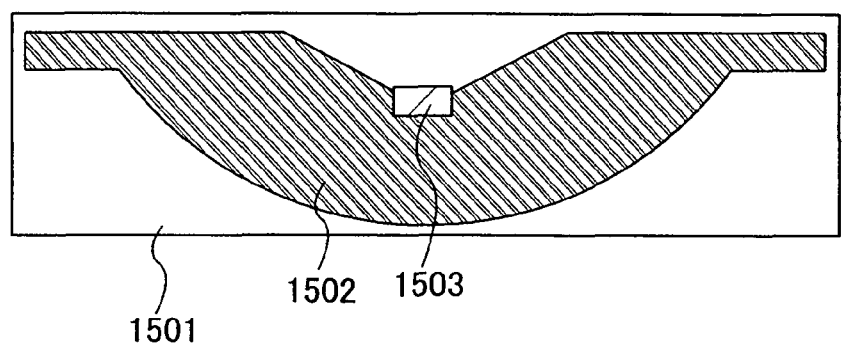

As shown in FIG. 14A, a memory element portion 1404 that has a memory element, a circuit portion 1421, and an antenna 1431 are formed over a substrate 1400. FIGS. 14A and 14B show a state midway through the production process in which a memory element portion, a circuit portion, and an antenna are formed over the substrate 1400 that can withstand production conditions. The memory element portion, the circuit portion, and the antenna may each be fabricated by appropriate selection of materials and manufacturing steps similar to those described in the above embodiment modes.

A peeling layer 1452 is provided over the substrate 1400, and an insulating layer 1453 is provided over the peeling layer 1452. Over the peeling layer 1452 and the insulating layer 1453, a transistor 1441 and a transistor 1442 are provided in the memory element portion 1404 and in the circuit portion 1421, respectively. An insulating layer 1461, an insulating layer 1454, and an insulating layer 1455 are formed over the transistor 1441 and the transistor 1442, and a memory element 1443 is formed over the insulating layer 1455. The memory element 1443 has a first conductive layer 110$d$ formed over the insulating layer 1455, a metal oxide layer 111$d$ formed using the first conductive layer 110$d$, a layer 1458 that includes a semiconductor layer and an organic compound layer, and a second conductive layer 114, where the metal oxide layer 111$d$ and the layer 1458 that includes a semiconductor layer and an organic compound layer are interposed between the first conductive layer 110$d$ and the second conductive layer 114 and the metal oxide layer 111$d$ is formed in contact with the first conductive layer 110$d$. It is to be noted that, although not shown in FIGS. 14A and 14B, the memory elements 1443 formed in a plurality are separated individually by an insulating layer 1460$b$ that functions as a partition wall.

The first conductive layer 110$d$ is connected to a wiring layer of the transistor 1441. On the other hand, the second conductive layer 114 is connected to a conductive layer 1457$c$ stacked over a wiring layer 1456$a$. Furthermore, a conductive layer 1457 and the antenna 1431 shown in FIG. 14A are stacked and provided over the insulating layer 1455. In FIG. 14B, the above conductive layer is formed as a conductive layer 1457$a$, a conductive layer 1457$b$, a conductive layer 1457$e$, and a conductive layer 1457$f$, where the conductive layer 1457$a$ and an antenna 1431$a$, the conductive layer 1457$b$ and an antenna 1431$b$, and the conductive layer 1457$f$ and an antenna 1431$d$ are each stacked together. It is to be noted that the conductive layer 1457$e$ and an antenna 1431$c$ are formed in an opening reaching to a wiring layer 1456$b$ formed in the insulating layer 1455, and the conductive layer 1457$e$ and the wiring layer 1456$b$ are connected to each other. In this way, the antenna, the memory element portion 1404, and the circuit portion 1421 are connected electrically. Furthermore, the conductive layer 1457$a$, the conductive layer 1457$b$, the conductive layer 1457$e$, and the conductive layer 1457$f$ formed under the antenna 1431$a$, the antenna 1431$b$, the antenna 1431$c$, and the antenna 1431$d$, respectively, each have an effect of improving the adhesiveness of the insulating layer 1455 and the antenna. In the present embodiment mode, a polyimide film for the insulating layer 1455; titanium films for the conductive layer 1457$a$, the conductive layer 1457$b$, the conductive layer 1457$e$, and the conductive layer 1457$f$; and aluminum films for the antenna 1431$a$, the antenna 1431$b$, the antenna 1431$c$, and the antenna 1431$d$ are all used.

It is to be noted that openings (also called contact holes) are formed in the insulating layer 1455 to connect the first conductive layer 110$d$ and transistor 1441, the conductive layer 1457$c$ and wiring layer 1456$a$, and the conductive layer 1457$e$ and wiring layer 1456$b$ to each other. Because a lower resistance results from an increase in the size of an opening and an increase in the area of the amount of which conductive layers come into contact with each other, in the present embodiment mode, the sizes of openings are set to increase, in order, so that an opening connecting the first conductive layer 110$d$ and the transistor 1441 is the smallest, an opening connecting the conductive layer 1457$c$ and the wiring layer 1456$a$ is the next largest, and an opening connecting the conductive layer 1457$e$ and the wiring layer 1456$b$ is the largest. In the present embodiment mode, the opening connecting the first conductive layer 110$d$ and the transistor 1441 is set to be 5 μm×5 μm, the opening connecting the conductive layer 1457$c$ and the wiring layer 1456$a$ is set to be 50 μm×50 μm, and the opening connecting the conductive layer 1457$e$ and the wiring layer 1456$b$ is set to be 500 μm×500 μm.

In the present embodiment mode, a distance a from the insulating layer 1460$a$ to the antenna 1431$b$ is set to be 500 μm or more, a distance b from an edge of the second conductive layer 114 to an edge of the insulating layer 1460$a$ is set to be 250 μm or more, a distance c from an edge of the second conductive layer 114 to an edge of the insulating layer 1460$c$ is set to be 500 μm or more, and a distance d from the insulating layer 1460$c$ to the antenna 1431$c$ is set to be 250 μm or more. It is to be noted that, in the circuit portion 1421, the insulating layer 1460$c$ is partially formed, and there is a region of the transistor 1442 that is covered by the insulating layer 1460$c$ and a region that is not.

By use of a semiconductor device like the one above, a power supply voltage and signals are input from an external input portion into the memory element portion 1404 directly, whereby writing of data (which corresponds to information) to or reading of data from the memory element portion 1404 becomes possible.

In addition, with respect to the memory element portion, the antenna may be formed as a structure that overlaps with the memory element portion or as a structure that does not overlap with the memory element portion but is formed in the periphery thereof. Furthermore, when the antenna is formed to overlap with the memory element portion, the antenna may be formed as a structure that overlaps over the entire surface of the memory element portion or as a structure that overlaps with only a portion of the memory element portion. For example, with the structure as one in which the antenna portion and the memory element portion overlap with each other, due to effects of noise in the signals transmitted whenever the antenna is communicating with a device or of changes in the electromotive force or the like generated by electromagnetic induction, the number of operation defects of the semiconductor device can be decreased.

Moreover, for a method of transmitting signals in the aforementioned semiconductor device to which data can be input and from which data can be output by non-contact, an electromagnetic coupling method, an electromagnetic induction method, an microwave method, or the like can be used. The transmission method may be selected appropriately in consideration of the intended application, and the most suitable antenna for the transmission method used may be provided.

In FIGS. 15A to 15D, examples are shown of a semiconductor device formed as a chip that has a conductive layer 1502 that functions as an antenna and a memory element portion 1503 formed over a substrate 1501. It is to be noted that, in addition to the memory element in the semiconductor device, an integrated circuit or the like may also be mounted therein.

When a microwave method (for example, frequency in the UHF band (from 860 to 960 MHz), at the 2.45 GHz band, or the like) is applied for the method of transmission of signals in the semiconductor device, the configuration of the length or the like of a conductive layer that functions as an antenna may be set appropriately in consideration of the wavelength of the electromagnetic waves used for the transmission of signals. For example, the conductive layer that functions as an antenna can be formed into a linear shape (for example, as a dipole antenna (refer to FIG. 15A)), a planar shape (for example, as a patch antenna (refer to FIG. 15B)), a ribbon shape (refer to FIGS. 15C and 15D), or the like. Furthermore, the shape of the conductive layer that functions as an antenna is not limited to a linear shape but may be formed into a curved line or into a meandering shape in consideration of the wavelength of the electromagnetic waves, or the conductive layer may be formed as a combination of any of these shapes.

Moreover, when an electromagnetic coupling method or electromagnetic induction method (for example, frequency at the 13.56 GHz band) is applied for the method of transmission of signals in the semiconductor device, because electromagnetic induction by changes in the magnetic field density is used, it is preferable that the conductive layer that functions as an antenna be formed into a circular shape (for example, as a loop antenna) or a spiral shape (for example, as a spiral antenna).

Moreover, when the electromagnetic coupling method or electromagnetic induction method is applied and the semiconductor device including an antenna is provided so as to come into contact with metal, an eddy current flows with changes in the magnetic field; by generation of a demagnetizing field by the eddy current, changes in the magnetic field are weakened, and the distance at which communication can be exchanged decreases. For that reason, it is preferable that a material with magnetic permeability be provided between the semiconductor device and the metal. By provision of a material with magnetic permeability between the semiconductor device and the metal, the eddy current can be suppressed, and the decrease in the distance at which communication can be exchanged can be suppressed. It is to be noted that, for the magnetic material, either ferrite or a metallic thin film, where each has a high magnetic permeability but little high frequency loss, can be used.

Furthermore, when an antenna is provided, a semiconductor element such as a transistor or the like and the conductive layer that functions as an antenna may be provided over a single substrate by being directly built into the substrate; alternatively, after a semiconductor element and the conductive layer that functions as an antenna are formed over separate substrates, the substrates may be attached to each other so that the semiconductor element and the conductive layer that functions as an antenna are electrically connected to each other.

In the semiconductor device presented in the present embodiment mode, by memory elements of the present invention being included in the semiconductor device, variations in programming behavior from memory element to memory element can be reduced. For this reason, a semiconductor device with excellent writing characteristics can be fabricated. In addition, an increase in writing voltage can be prevented, and the margin for reading voltage can be widened. Consequently, the amount of freedom in design of the semiconductor device can be increased.

Not only is data written to the semiconductor device just once, but additional data (appended data) can also be written to the semiconductor device while memory elements to which data has not been written still remain. On the other hand, because data cannot be erased once writing to the memory element has been performed, forgery due to rewriting of data can be prevented. In addition, reading and writing of data can be performed by non-contact. Moreover, because the memory element of the present invention is one that has a simple structure in which a metal oxide layer, a semiconductor layer, and an organic compound layer are interposed between a pair of conductive layers, a semiconductor device with excellent writing characteristics can be manufactured at low cost.

It is to be noted that the present embodiment mode can be freely combined with any of the other embodiment modes and embodiments.

Embodiment 1

In the present embodiment, a memory element that has a metal oxide layer in contact with a first conductive layer and a semiconductor layer was fabricated, and current-voltage characteristics at the time of writing of data in a memory element that is one example of a structure of the present invention are presented. The memory element is an element in which a first conductive layer, a metal oxide layer, a semiconductor layer, an organic compound layer, and a second conductive layer are stacked, in order, over a substrate; a formation method for this memory element will be described using FIG. 1A. The memory element was connected to a 500 kΩ resistor in series, and the current-voltage characteristics were measured by a sweep method in which the amount of the applied voltage was continuously changed.

First, over the substrate, a film of titanium was formed for the first conductive layer 110 by film formation using a sputtering method. The film thickness was set to be 100 nm.

Next, a surface of the first conductive layer 110 was oxidized by plasma treatment in the presence of oxygen, to form a metal oxide layer 111 containing titanium oxide at a thickness of 10 nm.

Subsequently, the substrate over which the metal oxide layer 111 and the like were formed was fixed to a substrate holder provided in a vacuum deposition chamber so that the surface over which the metal oxide layer 111 was formed is the lower surface. Then, on the metal oxide layer 111, a film of tin oxide was formed at a film thickness of 1 nm using an evaporation method by resistive heating, whereby the semiconductor layer 112 was formed.

Next, on the semiconductor layer 112, a film of CzPA was formed using an evaporation method by resistive heating so as to have a film thickness of 10 nm, whereby the organic compound layer 113 was formed.

Furthermore, on the organic compound layer 113, the second conductive layer 114 was formed of aluminum using an evaporation method by resistive heating so as to have a film thickness of 200 nm.

Figure 19:
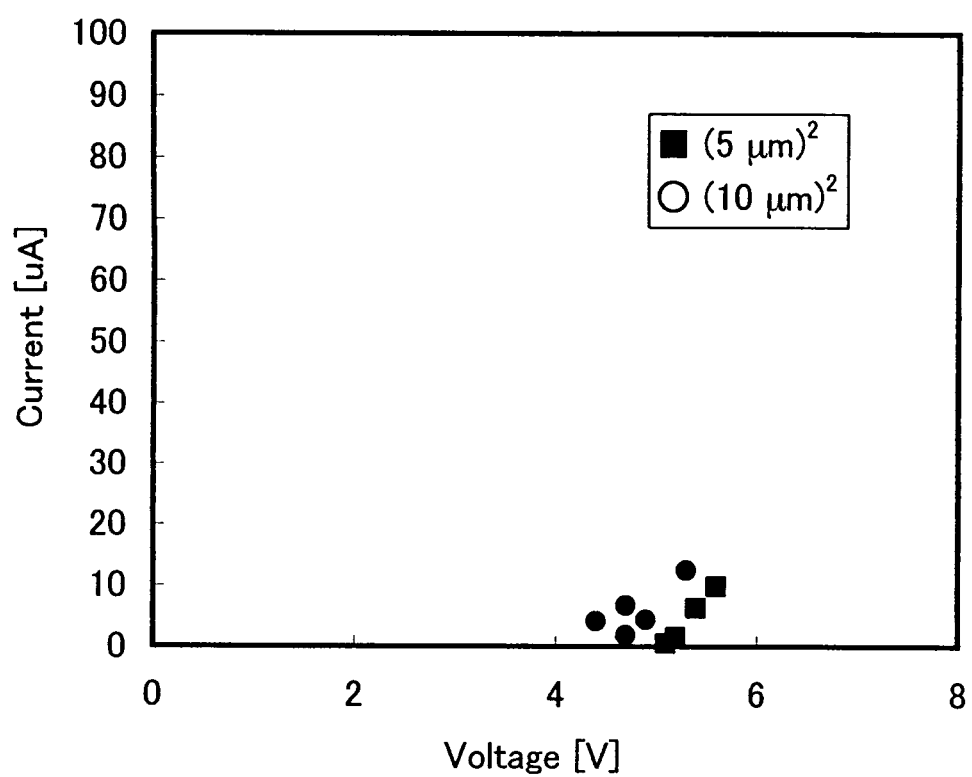
FIG. 19 is a diagram showing the relationship between current and voltage at the time writing occurs in a memory element of the present invention.

A voltage is applied by a sweep method to the memory element obtained as described above, and the relationship between the current and voltage at the time writing is performed is shown in FIG. 19. The sizes of the memory elements that were used are $(5 \ \mu m)^2$ and $(10 \ \mu m)^2$, and the sample numbers n were 5 and 4 for the $(5 \ \mu m)^2$ memory element and the $(10 \ \mu m)^2$ memory element, respectively. From FIG. 19, it can be seen that there are no great variations in the writing voltage in a memory element of either size, the amount of current flowing during the writing period is approximately the same low amount, and power consumption is low. Accordingly, by use of the structure of the present invention, variations in programming behavior from memory element to memory element can be suppressed. Consequently, by the present invention, a memory element, as well as a memory device and a semiconductor device that each have the memory element, with excellent writing characteristics can be obtained.

Embodiment 2

In the present embodiment, the distribution of the writing voltage of each memory element was examined. A memory element fabricated for use in the present embodiment is an element in which a first conductive layer, a metal oxide layer, a semiconductor layer, an organic compound layer, and a second conductive layer are formed over a substrate, and the manufacturing method of this memory element will be described below using FIG. 1A.

First, on a substrate, a film of titanium was formed for a first conductive layer 110 by film formation using a sputtering method. Film thickness was set to be 100 nm.

Next, a surface of the first conductive layer 110 was oxidized by plasma treatment in the presence of oxygen, whereby a metal oxide layer 111 that contains titanium oxide was formed at a thickness of 10 nm.

Subsequently, the substrate over which the metal oxide layer 111 and the like were formed was fixed to a substrate holder provided in a vacuum deposition chamber so that the surface over which the metal oxide layer 111 is formed is the lower surface. Then, over the metal oxide layer 111, a film of tin oxide at a film thickness of 1 nm was formed using an evaporation method by resistive heating, whereby the semiconductor layer 112 was formed.

Next, over the semiconductor layer 112, the organic compound layer 113 was formed at 10 nm using an evaporation method by resistive heating. For the organic compound layer 113 of the memory element fabricated in the present embodiment, TPAQn, TCzB, CzPA, or CzBPA was used.

Then, over the organic compound layer 113, the second conductive layer 114 was formed of aluminum using an evaporation method by resistive heating so as to have a film thickness of 200 nm.

These kinds of memory elements were each connected to a TFT, and the accumulated programming ratio with respect to applied voltage for a variety of elements was examined. It is to be noted that, not limited to the present embodiment, the accumulated programming ratio is expressed by Formula (1) shown below.

$$\text{Accumulated Programming Ratio (\%)} = \frac{\text{Total Number of Programmed Memory Element}}{\text{Total Number of Memory Element}} \times 100 \quad \text{Formula (1)}$$

Figure 20A:
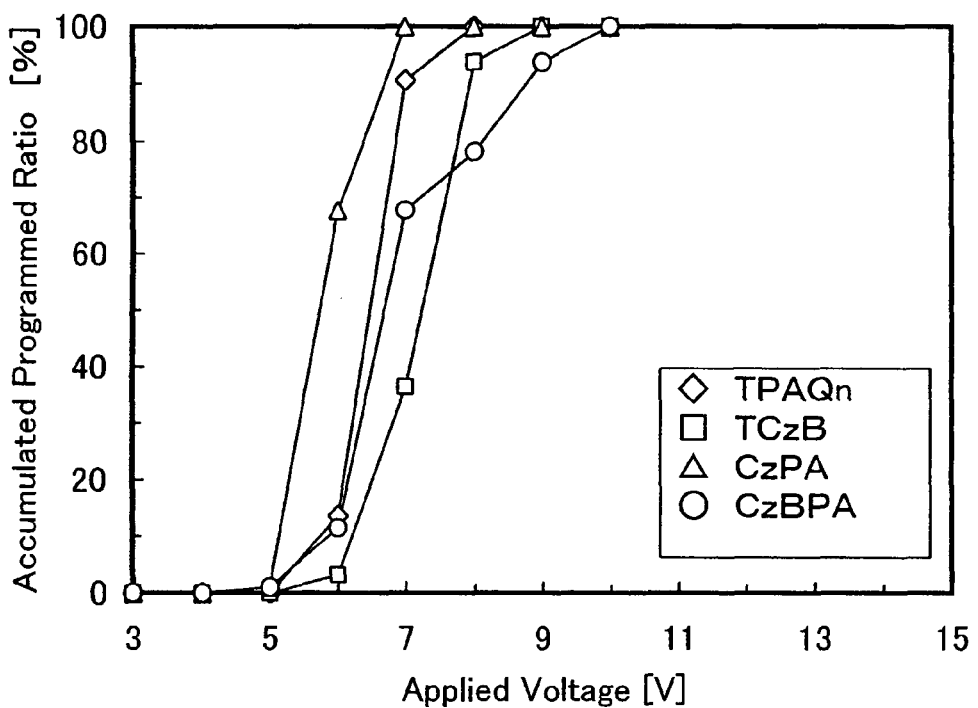
FIGS. 20A and 20B are diagrams showing the accumulated programming ratio with respect to applied voltage of a memory element of the present invention.

Measurement results are shown in FIG. 20A. For the memory element fabricated for use in the present embodiment as described above, there are four kinds of elements that use TPAQn, TCzB, CzPA, or CzBPA in the organic compound layer 113. Each of the four kinds of memory elements has dimensions of $(5 \ \mu m)^2$, and the number, n, of memory elements of each kind was 96. Each length of time during which voltage was applied in the memory element was set to 10 milliseconds. From FIG. 20A, a sharp rise in the accumulated programming ratio with respect to writing voltage, no matter which organic compound layer was used, is shown, and it was understood that variations in behavior from memory element to memory element were small. Note that the rise in the accumulated programming ratio is sharpest for the memory element in which CzPA is used in the organic compound layer 113, and the range of that writing voltage was extremely small, approximately 2 V.

Figure 20B:
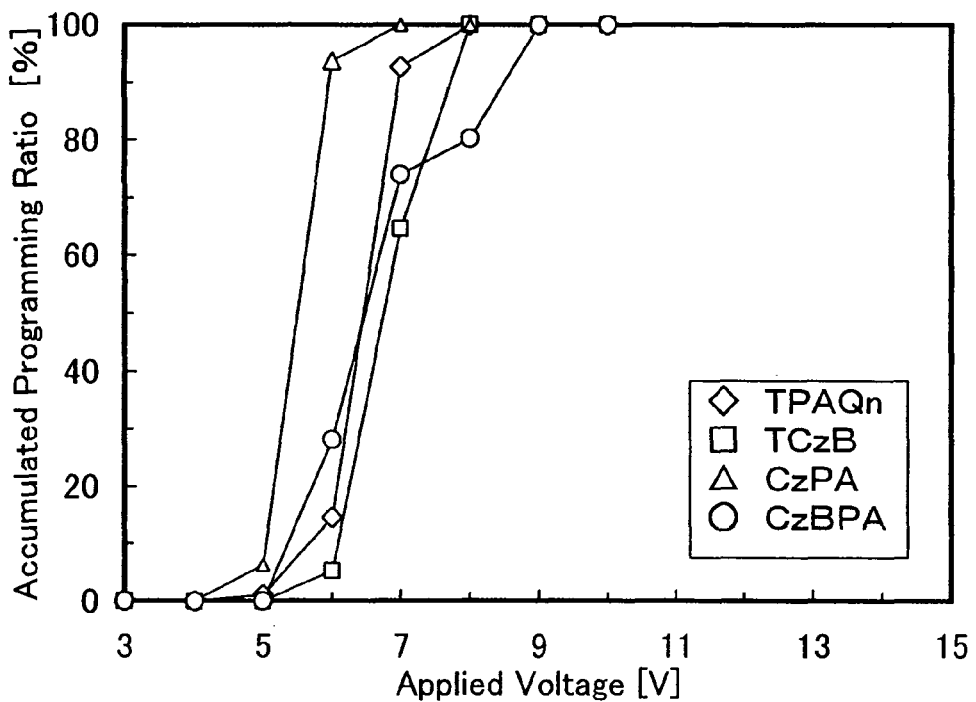

In addition, a similar evaluation was performed for a case when a $(10 \ \mu m)^2$ memory element was used. For a memory element with dimensions of $(10 \ \mu m)^2$, the number, n, of each kind of memory element was set to 96, as well, and the length of time during which each voltage was applied to a memory element was set to 10 milliseconds, as above. Measurement results are shown in FIG. 20B. Even for a memory element with dimensions of $(10 \ \mu m)^2$, a sharp rise in the accumulated programming ratio with respect to writing voltage is shown, and it was understood that variations in behavior from memory element to memory element were small.

Consequently, by the present invention, a memory element, as well as a memory device and a semiconductor device that each have the memory element, with excellent writing characteristics can be obtained. In addition, an increase in writing voltage can be prevented, and the margin for the reading voltage can be widened. Consequently, the amount of freedom in design of the memory device and semiconductor device can be increased.

Embodiment 3

In the present embodiment, the accumulated programming ratio with respect to applied voltage for a memory element with a structure differing from that of Embodiment 3 was measured. First, a memory element fabricated for use in the present embodiment is an element in which a first conductive layer, a metal oxide layer, a semiconductor layer, an organic compound layer, and a second conductive layer are stacked, in order, over a substrate, and the manufacturing method of this memory element will be described, as in Embodiment 2, using FIG. 1A.

Over a substrate, a film of titanium was formed for a first conductive layer 110 by film formation using a sputtering method. The film thickness of the first conductive layer 110 was set to be 100 nm.

Next, a surface of the first conductive layer 110 was oxidized by plasma treatment in the presence of oxygen, whereby a metal oxide layer 111 that contains titanium oxide was formed at a thickness of 10 nm.

Subsequently, the substrate over which the metal oxide layer 111 and the like were formed was fixed to a substrate holder provided in a vacuum deposition chamber so that the surface over which the metal oxide layer 111 is formed is the lower surface. Then, on the metal oxide layer 111, a film of tin oxide at a film thickness of 1 nm or 5 nm was formed using an evaporation method by resistive heating, whereby the semiconductor layer 112 was formed.

Next, on the semiconductor layer 112, a film of CzPA was formed using an evaporation method by resistive heating so as to have a film thickness of 200 nm, whereby the organic compound layer 113 is formed.

Furthermore, on the organic compound layer 113, the second conductive layer 114 was formed of aluminum using an evaporation method by resistive heating so as to have a film thickness of 200 nm.

Figure 21A:
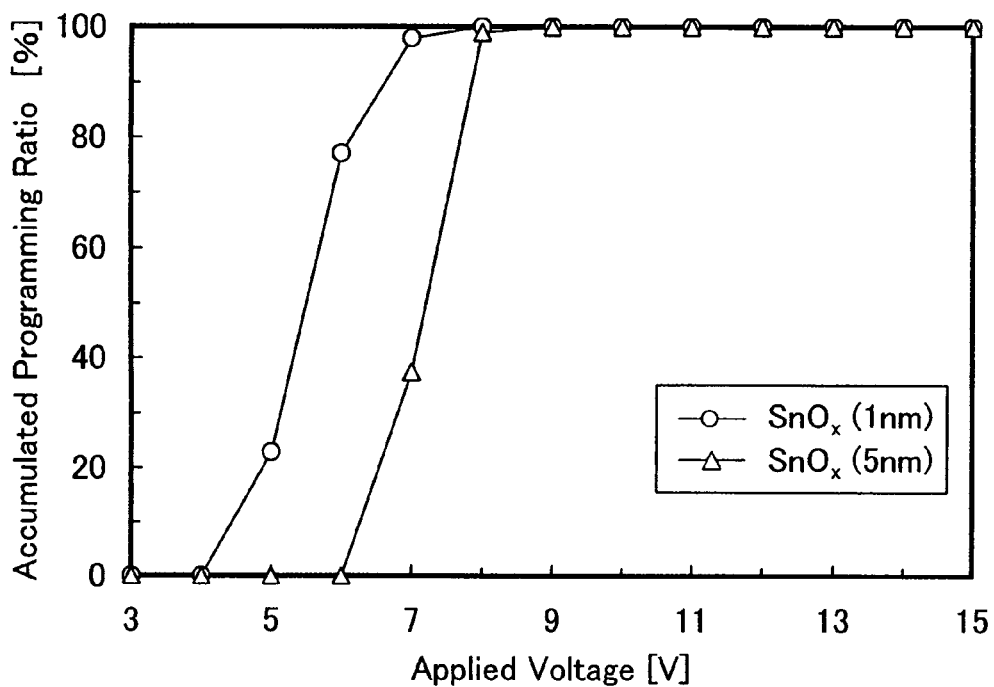
FIGS. 21A and 21B are diagrams showing the accumulated programming ratio with respect to applied voltage of a memory element of the present invention.
Figure 21B:
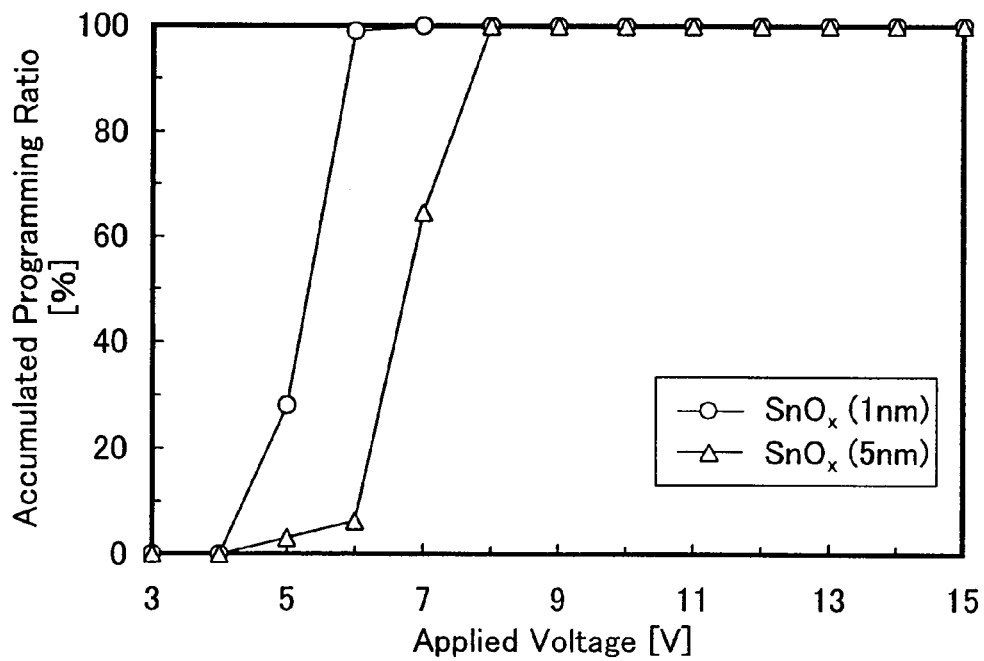

The aforementioned memory elements were each connected to a TFT, and the accumulated programming ratio with respect to applied voltage for a variety of elements was examined. Measurement results for a $(5\ \mu m)^2$ memory element are shown in FIG. 21A, and measurement results for a $(10\ \mu m)^2$ memory element are shown in FIG. 21B. Note that the time during which voltage was applied to each element was set at 10 milliseconds, and the number, n, for a memory element of each size was set to 96.

From FIGS. 21A and 21B, a sharp rise in the accumulated programming ratio with respect to writing voltage, no matter what the size of the element or film thickness of the semiconductor layer is, is shown, and it was understood that variations in behavior from memory element to memory element were small.

Consequently, by the present invention, a memory element, as well as a memory device and a semiconductor device that each have the memory element, with excellent writing characteristics can be obtained. In addition, an increase in writing voltage can be prevented, and margin for the reading voltage can be widened. Consequently, the amount of freedom in design of the memory device and semiconductor device can be increased.

Embodiment 4

In the present embodiment, the accumulated programming ratio with respect to applied voltage when writing is applied at a time differing from that of Embodiment 3 was examined. The memory element fabricated for use in the present embodiment is an element in which a first conductive layer, a metal oxide layer, a semiconductor layer, an organic compound layer, and a second conductive layer are formed over a substrate, and the manufacturing method of this memory element will be described, as in Embodiments 2 and 3, using FIG. 1A.

Over a substrate, a film of titanium was formed for a first conductive layer 110 by film formation using a sputtering method. The film thickness was set to be 100 nm.

Next, a surface of the first conductive layer 110 was oxidized by plasma treatment in the presence of oxygen, whereby a metal oxide layer 111 that contains titanium oxide was formed at a thickness of 10 nm.

Subsequently, the substrate over which the metal oxide layer 111 and the like were formed was fixed to a substrate holder provided in a vacuum deposition chamber so that the surface over which the metal oxide layer 111 is formed is the lower surface. Then, on the metal oxide layer 111, a film of tin oxide at a film thickness of 1 nm was formed using an evaporation method by resistive heating, whereby the semiconductor layer 112 was formed.

Next, on the semiconductor layer 112, a film of CzPA was formed using an evaporation method by resistive heating so as to have a film thickness of 10 nm, whereby the organic compound layer 113 was formed.

Furthermore, on the organic compound layer 113, the second conductive layer 114 was formed of aluminum using an evaporation method by resistive heating so as to have a film thickness of 200 nm. The dimensions of the elements used were $(5\ \mu m)^2$ and $(10\ \mu m)^2$.

Figure 22:
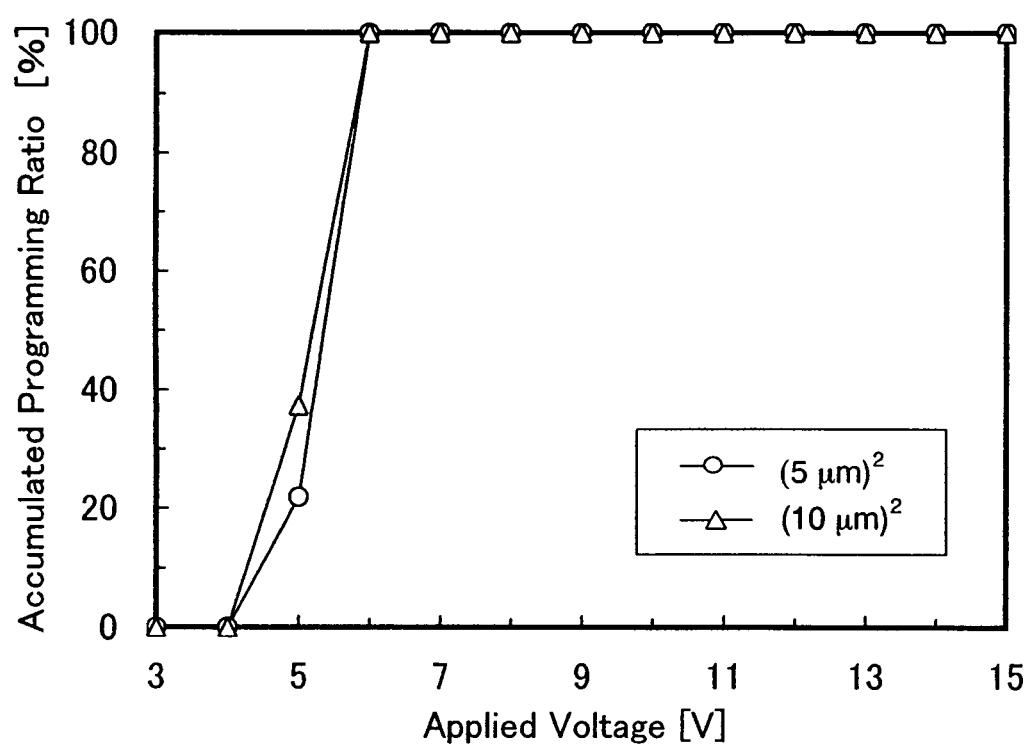
FIG. 22 is a diagram showing the accumulated programming ratio with respect to applied voltage of a memory element of the present invention.
Figure 23:
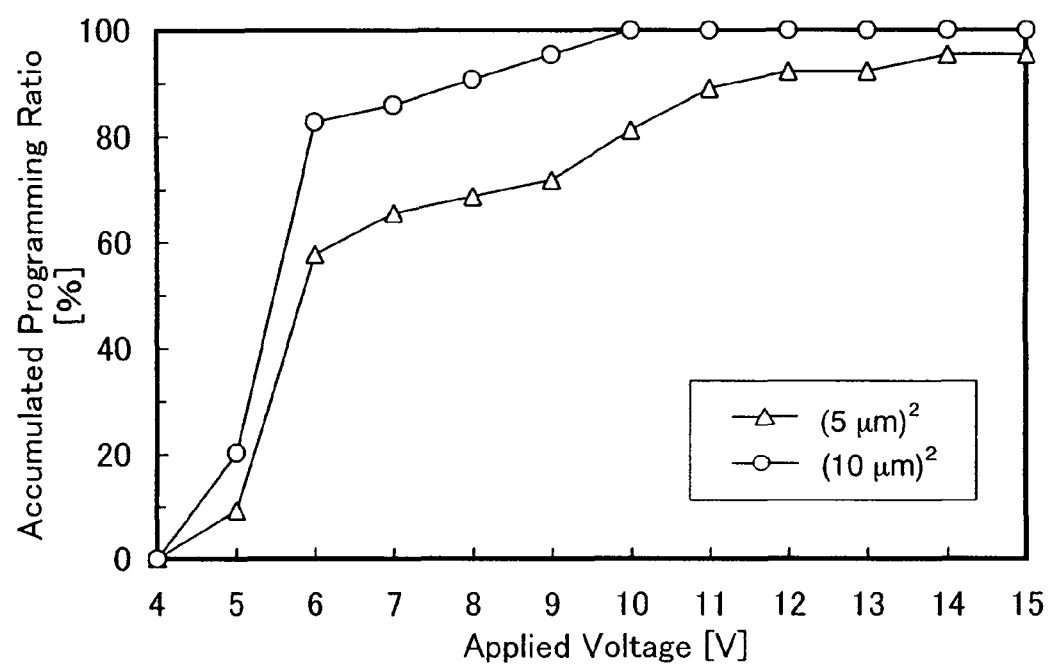
FIG. 23 is a diagram showing the accumulated programming ratio with respect to applied voltage of a conventional memory element.

The aforementioned memory elements were each connected to a TFT, and the writing success rate with respect to applied voltage for each of the $(5\ \mu m)^2$ memory element and $(10\ \mu m)^2$ memory element was examined. It is to be noted that the time during which voltage was applied to each element was set at 1 millisecond in the present embodiment compared to 10 milliseconds for that of Embodiment 3. Measurement results are shown in FIG. 22. The sample numbers, n, for the $(5\ \mu m)^2$ memory element and for the $(10\ \mu m)^2$ memory element were each set to 1536.

From FIG. 22, a sharp rise in the accumulated programming ratio with respect to writing voltage even for 1 millisecond, no matter what the size of the element is, is shown, and it was understood that variations in behavior from memory element to memory element were small.

Consequently, by the present invention, a memory element, as well as a memory device and a semiconductor device that each have the memory element, with excellent writing characteristics can be obtained. In addition, an increase in writing voltage can be prevented, and the margin for reading voltage can be widened. Consequently, the amount of freedom in design of the memory device and semiconductor device can be increased.

Embodiment 5

Figure 17A:
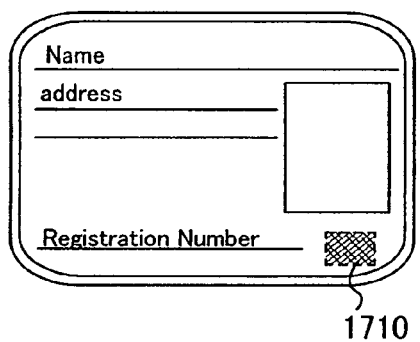
FIGS. 17A to 17F are diagrams illustrating articles in which a semiconductor device of the present invention is mounted.
Figure 17B:
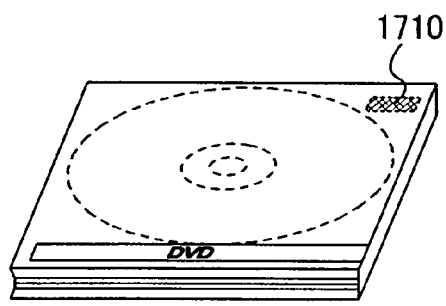
Figure 17C:
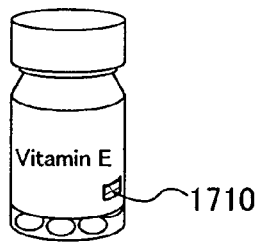
Figure 17D:
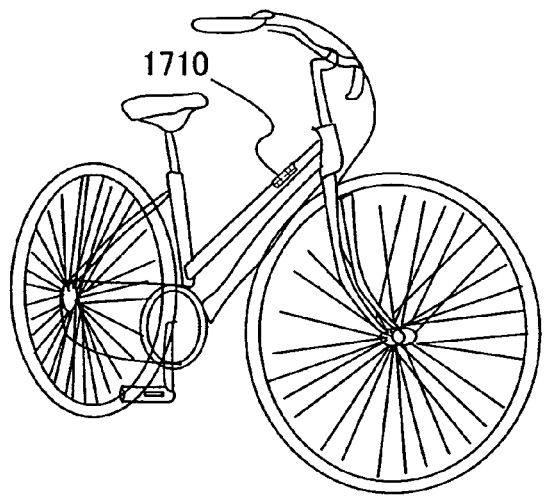
Figure 17E:
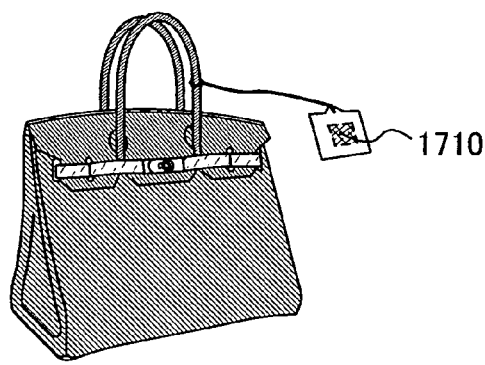
Figure 17F:
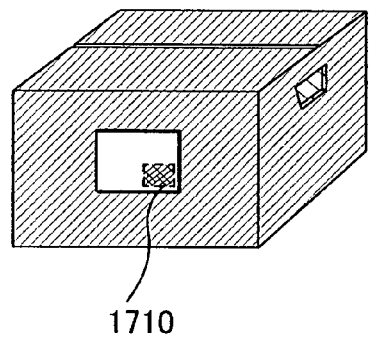

By the present invention, a semiconductor device that functions as a wireless chip can be formed. Applications for the wireless chip cover a broad range; for example, the wireless chip can be provided and used in articles such as paper currency, coins, securities, bearer bonds, certificates (driver's licenses, resident's cards, and the like; refer to FIG. 17A), packaging and containers (wrapping paper, bottles, and the like; refer to FIG. 17C), recording media (DVDS, video tapes, and the like; refer to FIG. 17B), vehicles (bicycles and the like; refer to FIG. 17D), personal belongings (bags, glasses, and the like), food products, plants, animals, clothing, articles for daily living, electronic devices, and the like, as well as for luggage tags (refer to FIGS. 17E and 17F). Electronic devices refer to liquid crystal display devices, EL display devices, television devices (also called simply television, TV set, and television set), cellular phones, and the like.

The semiconductor device 1710 of the present invention is fixed to an article by being mounted on a printed circuit board, affixed to a surface of the printed circuit board, or embedded into the printed circuit board. For example, for a book, the semiconductor device 1710 is embedded into the paper; for a package made of an organic resin, the semiconductor device 1710 is embedded into the organic resin and affixed to each article. The semiconductor device 1710 of the present invention is one in which a small, thin, and light-weight device is realized so that, even after the semiconductor device is fixed to an article, design characteristics of that article are not damaged. In addition, by provision of the semiconductor device 1710 in paper currency, coins, securities, bearer bonds, certificates, and the like, an authentication function can be provided, and if this authentication function is utilized, forgery can be prevented. Furthermore, by provision of the semiconductor device 1710 in packaging and containers, recording media, personal belongings, food products, clothing, articles for daily living, electronic devices, and the like, an improvement in system efficiency of an inspection system or the like can be realized.

Figure 18:
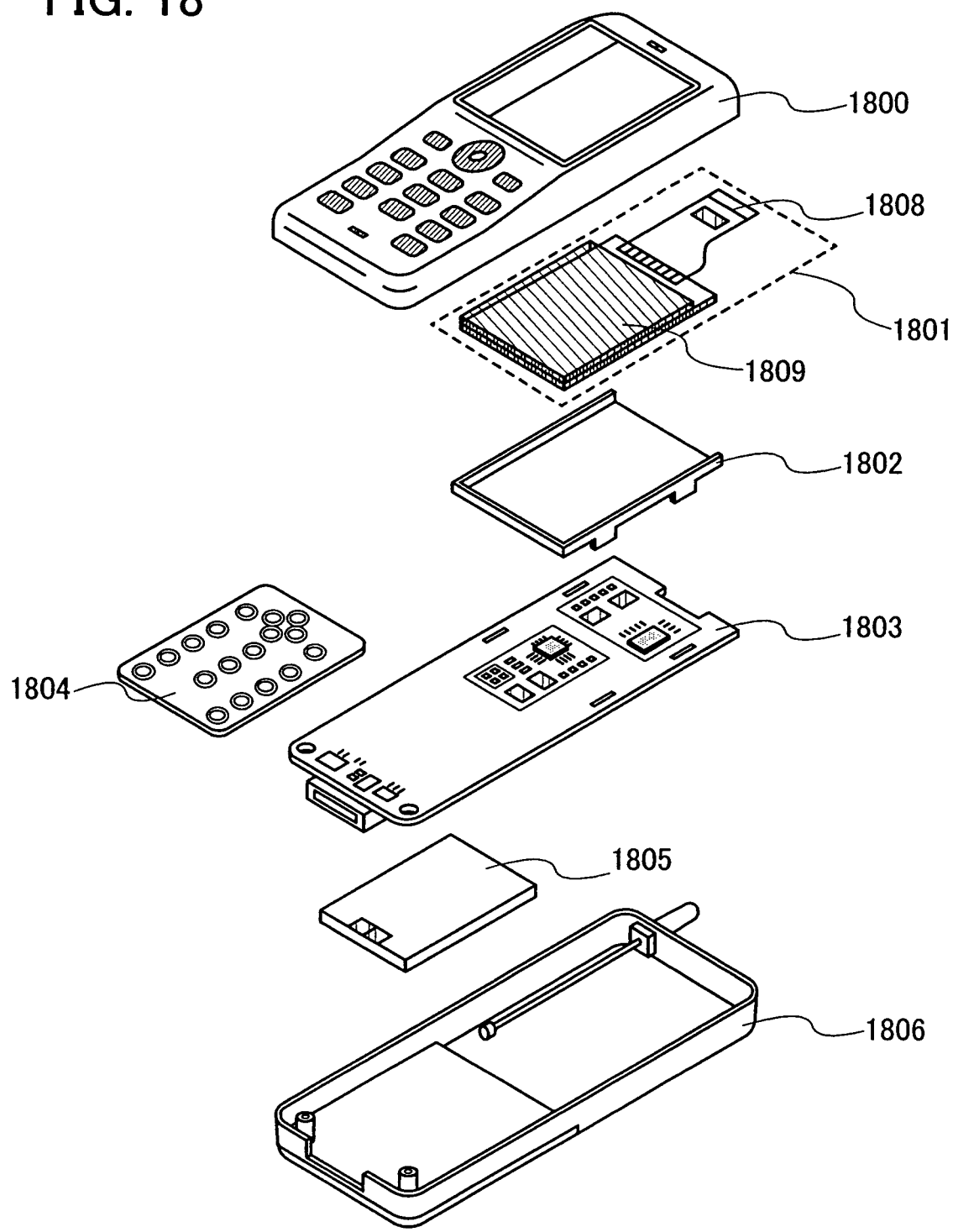
FIG. 18 is a diagram illustrating a cellular phone in which a semiconductor device of the present invention is mounted.

Next, one aspect of an electronic device in which the semiconductor device of the present invention is mounted will be described with reference to FIG. 18. The example given here of the electronic device is a cellular phone device that includes cases 1800 and 1806, a panel 1801, a housing 1802, a printed wiring board 1803, operation buttons 1804, and a battery 1805. The panel 1801 is incorporated into the housing 1802 detachably, and the housing 1802 is fitted to the printed wiring board 1803. The housing 1802 is matched to the panel 1801 incorporated into the electronic device, and the shape and measurements of the housing 1802 may be changed appropriately. A plurality of packaged semiconductor devices are mounted on the printed wiring board 1803, and the semiconductor device of the present invention can be used for one of these. Each of the plurality of semiconductor devices mounted on the printed wiring board 1803 functions as any of the following: a controller, a central processing unit (CPU), a memory, a power supply circuit, a speech processing circuit, a transmitting and receiving circuit, or the like.

The panel 1801 is bonded to the printed wiring board 1803 through a bonding film 1808. The above panel 1801, housing 1802, and printed wiring board 1803, as well as the operation buttons 1804 and the battery 1805, are placed inside the cases 1800 and 1806. A pixel region 1809 included in the panel 1801 is arranged so as to be visible through an aperture window provided in the case 1800.

As stated above, the semiconductor device of the present invention is small, thin, and light-weight; therefore, limited space inside the cases 1800 and 1806 of the electronic device can be used effectively. It is to be noted that the cases 1800 and 1806 show one example of the shape and outward appearance of a cellular phone, but the electronic device of the present invention can be configured in a variety of modes according to the functions and applications of the electronic device.

It is to be noted that the memory element of the present invention has a first conductive layer, a metal oxide layer, a semiconductor layer, an organic compound layer, and a second conductive layer, where the semiconductor layer and the organic compound layer are interposed between the first conductive layer and the second conductive layer, the metal oxide layer is provided in contact with the first conductive layer, and the semiconductor layer is provided in contact with the metal oxide layer. By use of this kind of memory element, variations in programming behavior from memory element to memory element can be reduced. For this reason, a semiconductor device with excellent writing characteristics can be fabricated. In addition, an increase in writing voltage can be prevented, and the margin for reading voltage can be widened. Consequently, the amount of freedom in design of the semiconductor device can be increased.

Furthermore, not only is data written to the semiconductor device just once, but additional data (appended data) can also be written to the semiconductor device while memory elements to which data has not been written still remain. On the other hand, because data cannot be erased once writing to the memory element has been performed, forgery due to rewriting of data can be prevented. Moreover, because the memory element of the present invention is one that has a simple structure in which a metal oxide layer, a semiconductor layer, and an organic compound layer are interposed between a pair of conductive layers, a semiconductor device with excellent writing characteristics can be manufactured at low cost.

It is to be noted that the present embodiment can be freely combined with any of the other embodiment modes and embodiments.

This application is based on Japanese Patent Application serial No. 2006-206685 filed in Japan Patent Office on Jul. 28, 2006, the entire contents of which are hereby incorporated by reference.

What is claimed is:

1. A manufacturing method for a memory device comprising:
   forming a first conductive layer over a substrate;
   forming a metal oxide layer by oxidizing a surface of the first conductive layer;
   forming a semiconductor layer over the metal oxide layer;
   forming an organic compound layer over the semiconductor layer; and
   forming a second conductive layer over the organic compound layer,
   wherein the organic compound layer is capable of changing a shape thereof by applying a voltage between the first conductive layer and the second conductive layer.

2. A manufacturing method for a memory device according to claim 1,
   wherein the oxidation of the surface of the first conductive layer is performed by plasma treatment in the presence of oxygen.

3. A manufacturing method for a memory device according to claim 1,
   wherein the oxidation of the surface of the first conductive layer is performed by heat treatment or by natural oxidation in the presence of oxygen.

4. A manufacturing method for a memory device according to claim 1,
   wherein the first conductive layer is electrically connected to a thin film transistor.

5. A manufacturing method for a memory device according to claim 1, further comprising forming a third conductive layer functioning as an antenna, over the substrate.

6. A manufacturing method for a memory device according to claim 1, further comprising:
   forming a peeling layer over the substrate; and
   separating a layer including the first conductive layer, the metal oxide layer, the semiconductor layer, the organic compound layer, and the second conductive layer, from the substrate.

7. A manufacturing method for a memory device comprising:
   forming a first conductive layer over a substrate;
   forming a metal oxide layer by oxidizing a surface of the first conductive layer;
   forming an organic compound layer over the metal oxide layer;
   forming a semiconductor layer over the organic compound layer; and
   forming a second conductive layer over the organic compound layer,
   wherein the organic compound layer is capable of changing a shape thereof by applying a voltage between the first conductive layer and the second conductive layer.

8. A manufacturing method for a memory device according to claim 7, wherein the oxidation of the surface of the first conductive layer is performed by plasma treatment in the presence of oxygen.

9. A manufacturing method for a memory device according to claim 7,
wherein the oxidation of the surface of the first conductive layer is performed by heat treatment or by natural oxidation in the presence of oxygen.

10. A manufacturing method for a memory device according to claim 7,
wherein the first conductive layer is electrically connected to a thin film transistor.

11. A manufacturing method for a memory device according to claim 7, further comprising forming a third conductive layer functioning as an antenna, over the substrate.

12. A manufacturing method for a memory device according to claim 7, further comprising:
forming a peeling layer over the substrate; and
separating a layer including the first conductive layer, the metal oxide layer, the organic compound layer, the semiconductor layer, and the second conductive layer, from the substrate.

13. The manufacturing method according to claim 1,
wherein the first conductive layer is selected from titanium, gold, platinum, nickel, tungsten, chromium, molybdenum, iron, cobalt, copper, and palladium.

14. The manufacturing method according to claim 1,
wherein the first conductive layer is titanium.

15. The manufacturing method according to claim 1,
wherein the second conductive layer is selected from titanium, gold, platinum, nickel, tungsten, chromium, molybdenum, iron, cobalt, copper, palladium, and aluminum.

16. The manufacturing method according to claim 1,
wherein the second conductive layer is aluminum.

17. The manufacturing method according to claim 1,
wherein the semiconductor layer is selected from molybdenum oxide, tin oxide, bismuth oxide, vanadium oxide, titanium oxide, iron oxide, chromium oxide, copper oxide, manganese silicon oxide, nickel oxide, and zinc oxide.

18. The manufacturing method according to claim 1,
wherein the semiconductor layer is tin oxide.

19. The manufacturing method according to claim 1,
wherein the formation of the organic compound layer is performed to allow the first conductive layer and the second conductive layer to come into contact with each other when a voltage is applied between the first conductive layer and the second conductive layer.

20. The manufacturing method according to claim 7,
wherein the first conductive layer is selected from titanium, gold, platinum, nickel, tungsten, chromium, molybdenum, iron, cobalt, copper, and palladium.

21. The manufacturing method according to claim 7,
wherein the first conductive layer is titanium.

22. The manufacturing method according to claim 7,
wherein the second, conductive layer is selected from titanium, gold, platinum, nickel, tungsten, chromium, molybdenum, iron, cobalt, copper, palladium, and aluminum.

23. The manufacturing method according to claim 7,
wherein the second conductive layer is aluminum.

24. The manufacturing method according to claim 7,
wherein the semiconductor layer is selected from molybdenum oxide, tin oxide, bismuth oxide, vanadium oxide, titanium oxide, iron oxide, chromium oxide, copper oxide, manganese silicon oxide, nickel oxide, and zinc oxide.

25. The manufacturing method according to claim 7,
wherein the semiconductor layer is tin oxide.

26. The manufacturing method according to claim 7,
wherein the formation of the organic compound layer is performed to allow the first conductive layer and the second conductive layer to come into contact with each other when a voltage is applied between the first conductive layer and the second conductive layer.

* * * * *